US012765246B2

(12) United States Patent
Baek

(10) Patent No.: US 12,765,246 B2
(45) Date of Patent: Oct. 13, 2026

(54) ELECTRONIC DEVICE AND DISPLAY PANEL

(71) Applicant: Samsung Display Co., Ltd., Yongin-Si (KR)

(72) Inventor: Daewon Baek, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 299 days.

(21) Appl. No.: 18/530,222

(22) Filed: Dec. 6, 2023

(65) Prior Publication Data

US 2024/0324418 A1 Sep. 26, 2024

(30) Foreign Application Priority Data

Mar. 23, 2023 (KR) ........................ 10-2023-0037646

(51) Int. Cl.
*H10K 59/80* (2023.01)

(52) U.S. Cl.
CPC ..... *H10K 59/8791* (2023.02); *H10K 59/8731* (2023.02)

(58) Field of Classification Search
CPC ........... H10K 59/8791; H10K 59/8731; H10K 59/131; H10K 59/873; H10K 59/879; H10K 59/12; H10K 59/80; H10K 59/1213; H10K 59/123; H10K 65/00; H10K 77/10; H10K 2102/351
See application file for complete search history.

(56) References Cited

U.S. PATENT DOCUMENTS 9,305,984 B2 * 4/2016 Kang ..................... H10K 59/12
2015/0123098 A1 * 5/2015 Kang .................. H10K 59/123 438/151
2016/0197129 A1 * 7/2016 Kang .................. H10D 86/021 257/40
2021/0376292 A1 * 12/2021 Choi .................... H10K 59/353
2022/0045151 A1 * 2/2022 Jeong ..................... H10K 59/80
2022/0069045 A1 * 3/2022 Ebisuno ............. H10K 59/1213
2022/0157925 A1 5/2022 Shin et al.
(Continued)

FOREIGN PATENT DOCUMENTS

KR 10-1993-0014163 A 7/1993
KR 101108166 B1 * 1/2012 ......... H10K 59/8731
(Continued)

*Primary Examiner* — Mohammed Shamsuzzaman
(74) *Attorney, Agent, or Firm* — Innovation Counsel LLP

(57) ABSTRACT

Provided is an electronic device including a display panel having a display region having a first region and a second region which has a lower transmittance than the first region, and a non-display region adjacent to the display region. The display panel may include a base substrate having a first base layer, a second base layer, and a first barrier layer disposed between the first base layer and the second base layer, a light-emitting element disposed on the base substrate, and an encapsulation layer disposed on the light-emitting element, and the first barrier layer may include a (1-1)-th barrier layer disposed on the first base layer and having a first thickness and a first refractive index, and a (1-2)-th barrier layer disposed on the (1-1)-th barrier layer and having a second thickness greater than the first thickness and a second refractive index less than the first refractive index.

19 Claims, 12 Drawing Sheets

(56) References Cited

U.S. PATENT DOCUMENTS

| | | | | |
|---|---|---|---|---|
| 2022/0352487 | A1* | 11/2022 | Li | H10K 59/122 |
| 2022/0367772 | A1* | 11/2022 | Oh | H01L 25/167 |

FOREIGN PATENT DOCUMENTS

| | | | | | |
|---|---|---|---|---|---|
| KR | 101137389 | B1 | * | 4/2012 | H10K 59/873 |
| KR | 10-2180037 | B1 | | 11/2020 | |
| KR | 10-2021-0077450 | A | | 6/2021 | |
| KR | 20220033573 | A | * | 3/2022 | H10K 59/353 |
| KR | 10-2022-0068299 | A | | 5/2022 | |

* cited by examiner

ELECTRONIC DEVICE AND DISPLAY PANEL

CROSS-REFERENCE TO RELATED APPLICATIONS

This U.S. non-provisional patent application claims priority under 35 U.S.C. § 119 to Korean Patent Application No. 10-2023-0037646, filed on Mar. 23, 2023, the entire contents of which are hereby incorporated by reference.

BACKGROUND

The present disclosure herein relates to an electronic device and a display panel, and more particularly, to an electronic device including a barrier layer.

An electronic device may include various electronic components such as a display panel and an electronic module. The electronic module may include a camera, an infrared sensor, a proximity sensor, or the like. The electronic module may be disposed under the display panel. The transmittance of a partial region of the display panel may be higher in transmittance than another partial region of the display panel. The electronic module may receive or output optical signals through a region having high transmittance.

SUMMARY

The present disclosure provides an electronic device and a display panel capable of reducing the reflectance for light incident by adjusting the thickness and refractive index of each of layers.

An embodiment of the inventive concept provides an electronic device including a display panel including a display region having a first region and a second region which has a lower transmittance than the first region, and a non-display region adjacent to the display region, the display panel includes a base substrate having a first base layer, a second base layer, and a first barrier layer disposed between the first base layer and the second base layer, and overlapping the display region and the non-display region, a light-emitting element disposed on the base substrate, and overlapping the display region, and an encapsulation layer disposed on the light-emitting element and covering the light-emitting element, and the first barrier layer includes a (1-1)-th barrier layer disposed on the first base layer and having a first thickness and a first refractive index, and a (1-2)-th barrier layer disposed on the (1-1)-th barrier layer, and having a second thickness greater than the first thickness and a second refractive index less than the first refractive index.

In an embodiment, the first thickness may be greater than or equal to about 153 nm and less than or equal to about 207 nm, and the second thickness may be greater than or equal to about 323 nm and less than or equal to about 437 nm.

In an embodiment, the first thickness may be greater than or equal to about 85 nm and less than or equal to about 115 nm, and the second thickness may be greater than or equal to about 340 nm and less than or equal to about 460 nm.

In an embodiment, a sum of the first thickness and the second thickness may be about 600 nm or less.

In an embodiment, the (1-1)-th barrier layer may include silicon oxynitride, and the (1-2)-th barrier layer may include silicon oxide.

In an embodiment, the first refractive index may be greater than or equal to about 1.56 and less than or equal to about 1.9, and the second refractive index may be greater than or equal to about 1.32 and less than or equal to about 1.62.

In an embodiment, the base substrate may further include a second barrier layer disposed on the second base layer, and the second barrier layer may include a (2-1)-th barrier layer disposed on the second base layer and having a third thickness and the first refractive index, and a (2-2)-th barrier layer disposed on the (2-1)-th barrier layer, having a fourth thickness greater than the third thickness, and having the second refractive index.

In an embodiment, the (2-1)-th barrier layer may include silicon oxynitride, and the (2-2)-th barrier layer may include silicon oxide.

In an embodiment, the encapsulation layer may include a first inorganic layer disposed on the light-emitting element, an organic layer disposed on the first inorganic layer, and a second inorganic layer disposed on the organic layer, and the first inorganic layer may include a first thin-film inorganic layer disposed on the light-emitting element and having a third refractive index, and a second thin-film inorganic layer disposed on the first thin-film inorganic layer and having a fourth refractive index greater than the third refractive index.

In an embodiment, the first thin-film inorganic layer may have a thickness of greater than or equal to about 170 nm and less than or equal to about 230 nm, and the second thin-film inorganic layer may have a thickness of greater than or equal to about 731 nm and less than or equal to about 989 nm.

In an embodiment, the first thin-film inorganic layer may have a thickness of greater than or equal to about 170 nm and less than or equal to about 230 nm, and the second thin-film inorganic layer may have a thickness of greater than or equal to about 638 nm and less than or equal to about 863 nm.

In an embodiment, the third refractive index may be greater than or equal to about 1.33 and less than or equal to about 1.63, and the fourth refractive index may be greater than or equal to about 1.7 and less than or equal to about 2.08.

In an embodiment, the electronic device may further include a pixel circuit disposed in the second region and electrically connected to the light-emitting element.

In an embodiment, the electronic device may further include a connection line connected to the light-emitting element in the first region, connected to the pixel circuit in the second region, and containing a light-transmissive material.

In an embodiment, a reflectance for light passing through the first region may be about 13% or less.

In an embodiment of the inventive concept, a display panel includes a base substrate having a first base layer, a second base layer, and a first barrier layer disposed between the first base layer and the second base layer, a light-emitting element disposed on the base substrate, and an encapsulation layer disposed on the light-emitting element and covering the light-emitting element, and the first barrier layer may include a (1-1)-th barrier layer disposed on the first base layer and having a first thickness and a first refractive index, and a (1-2)-th barrier layer disposed on the (1-1)-th barrier layer, having a second thickness greater than the first thickness, and having a second refractive index less than the first refractive index, a sum of the first thickness and the second thickness being about 600 nm or less.

In an embodiment, the first thickness may be greater than or equal to about 153 nm and less than or equal to about 207 nm, and the second thickness may be greater than or equal to about 323 nm and less than or equal to about 437 nm.

In an embodiment, the first thickness may be greater than or equal to about 85 nm and less than or equal to about 115 nm, and the second thickness may be greater than or equal to about 340 nm and less than or equal to about 460 nm.

In an embodiment, the first refractive index may be greater than or equal to about 1.56 and less than or equal to about 1.9, and the second refractive index may be greater than or equal to about 1.32 less than or equal to about 1.62.

In an embodiment, the (1-1)-th barrier layer may include silicon oxynitride, and the (1-2)-th barrier layer may include silicon oxide.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
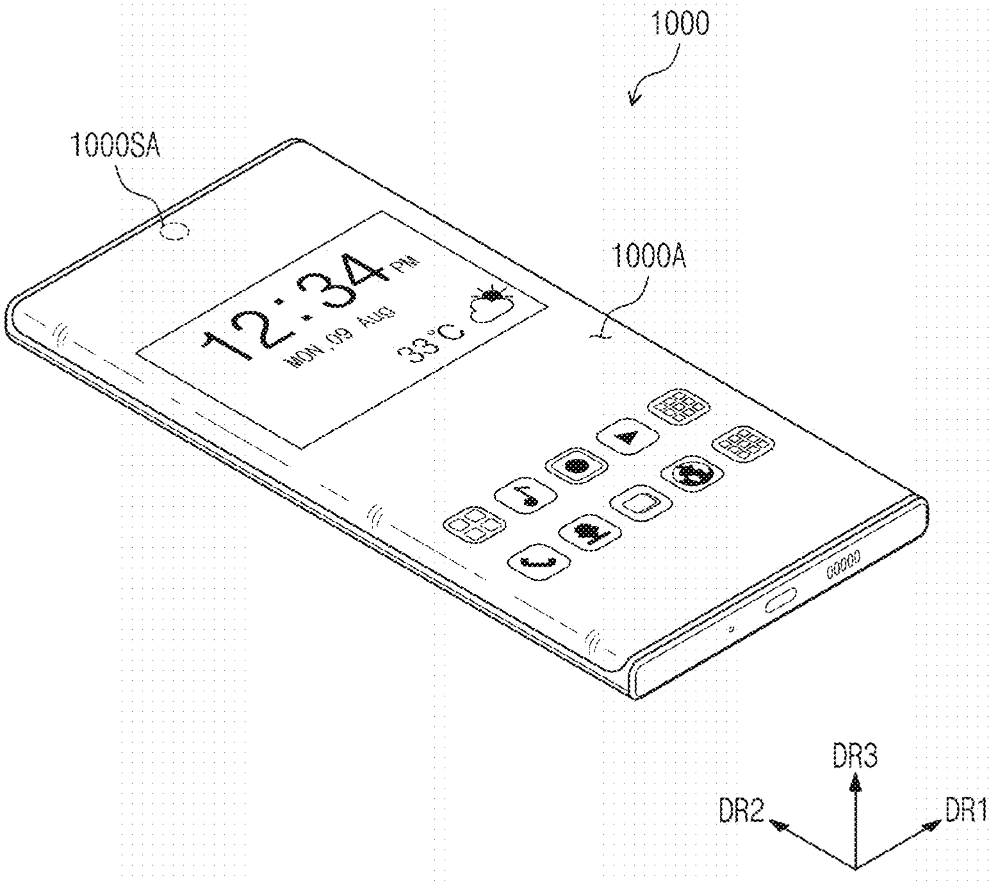
FIG. 1 is a perspective view of an electronic device according to an embodiment of the inventive concept.

In this specification, it will be understood that when an element (or a region, a layer, a portion, or the like) is referred to as being "on", "connected to" or "coupled to" another element, it may be directly disposed on, connected or coupled to the other element, or intervening elements may be disposed therebetween.

Like reference numerals or symbols refer to like elements throughout. In the drawings, the thickness, the ratio, and the size of the element are exaggerated for effective description of the technical contents. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the scope of the inventive concept. Similarly, a second element, component, region, layer or section may be termed a first element, component, region, layer or section. As used herein, the singular forms, "a", "an" and "the" are intended to include the plural forms as well, unless the context clearly indicates otherwise.

Also, terms of "below", "on lower side", "above", "on upper side", or the like may be used to describe the relationships of the elements illustrated in the drawings. These terms have relative concepts and are described on the basis of the directions indicated in the drawings.

It will be further understood that the terms "includes" and/or "have", when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the inventive concept will be described with reference to the accompanying drawings.

FIG. 1 is a perspective view of an electronic device 1000 according to an embodiment of the inventive concept.

Referring to FIG. 1, the electronic device 1000 may be activated in response to electrical signals. For example, the electronic device 1000 may be a mobile phone, a tablet computer, a monitor, a television, a car navigation system, a game console, or a wearable device, but an embodiment of the inventive concept is not limited thereto. FIG. 1 exemplarily illustrates a mobile phone as the electronic device 1000.

The electronic device 1000 may display an image through a display region 1000A. The display region 1000A may include a flat surface defined by a first direction DR1 and a second direction DR2 crossing the first direction DR1.

The display region 1000A may further include curved surfaces each bent from at least two sides of the flat surface. However, the shape of the display region 1000A is not limited thereto. For example, the display region 1000A may only include the flat surface, or may further include at least two, for example, four, curved surfaces bent from four sides of the flat surface.

A sensing region 1000SA may be defined in the display region 1000A of the electronic device 1000. FIG. 1 exemplarily illustrates one sensing region 1000SA, but the number of the sensing region 1000SA is not limited thereto. The sensing region 1000SA may be a portion of the display region 1000A. Therefore, the electronic device 1000 may display an image through the sensing region 1000SA. The sensing region 1000SA may have a higher light transmittance than another region.

An electronic module may be disposed in a region overlapping the sensing region 1000SA of the electronic device 1000. The electronic module may receive an external input transmitted through the sensing region 1000SA, or provide an output through the sensing region 1000SA. For example, the electronic module may be a sensor that measures a distance such as a camera module and a proximity sensor, a sensor that recognizes a part of a user's body (e.g., fingerprint, iris, or face), or a miniature lamp that emits light, and an embodiment of the inventive concept is not limited thereto.

A thickness direction of the electronic device 1000 may be defined by a third direction DR3 crossing the first direction DR1 and the second direction DR2.

Therefore, a front surface (or upper surface) and a rear surface (or lower surface) of each of members constituting the electronic device 1000 may be defined on the basis of the third direction DR3.

In this specification, the term "in a plan view" may mean a view in a direction perpendicular to the flat surface defined by the first direction DR1 and the second direction DR2. In this specification, the term "overlapping" may mean overlapping in a plan view unless particularly defined.

Figure 2:
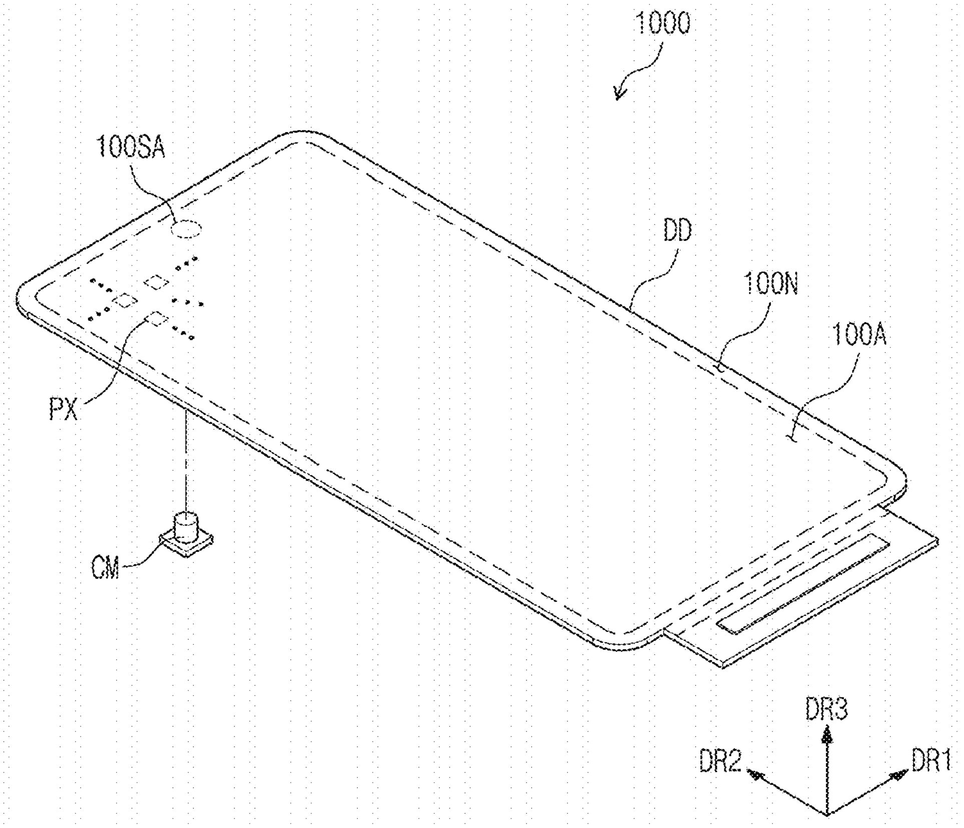
FIG. 2 is an exploded perspective view of an electronic device according to an embodiment of the inventive concept.

FIG. 2 is an exploded perspective view of an electronic device 1000 according to an embodiment of the inventive concept.

Referring to FIG. 2, the electronic device 1000 may include a display device DD and an electronic module CM. The display device DD may generate an image, and detect an input applied from the outside. The electronic module CM may be disposed under the display device DD, and may be, for example, a camera module or an infrared sensor module. The electronic module CM may be defined as a second electronic module when the display device DD is defined as a first electronic module constituting the electronic device 1000.

A display region 100A and a peripheral region 100N may be defined in the display device DD. The display region 100A may correspond to the display region 1000A illustrated in FIG. 1. A partial region of the display device DD may be defined as a sensing region 100SA, and the sensing region 100SA may have a higher transmittance than other regions of the display region 100A (hereinafter, a main display region).

The sensing region 100SA may be a portion of the display region 100A. The sensing region 100SA may correspond to the sensing region 1000SA illustrated in FIG. 1. That is, the sensing region 100SA may display an image, and pass through an external input provided to the electronic module CM, and/or an output from the electronic module CM. For example, when the electronic module CM is a camera module, the sensing region 100SA may provide natural light from the outside to the electronic module CM.

A plurality of pixels PX may be disposed in the display region 100A. Light-emitting elements of the pixels PX may be disposed in the display region 100A, and the light-emitting elements may not be disposed in the peripheral region 100N. The pixels PX may be disposed in each of the sensing region 100SA and the main display region.

Figure 3:
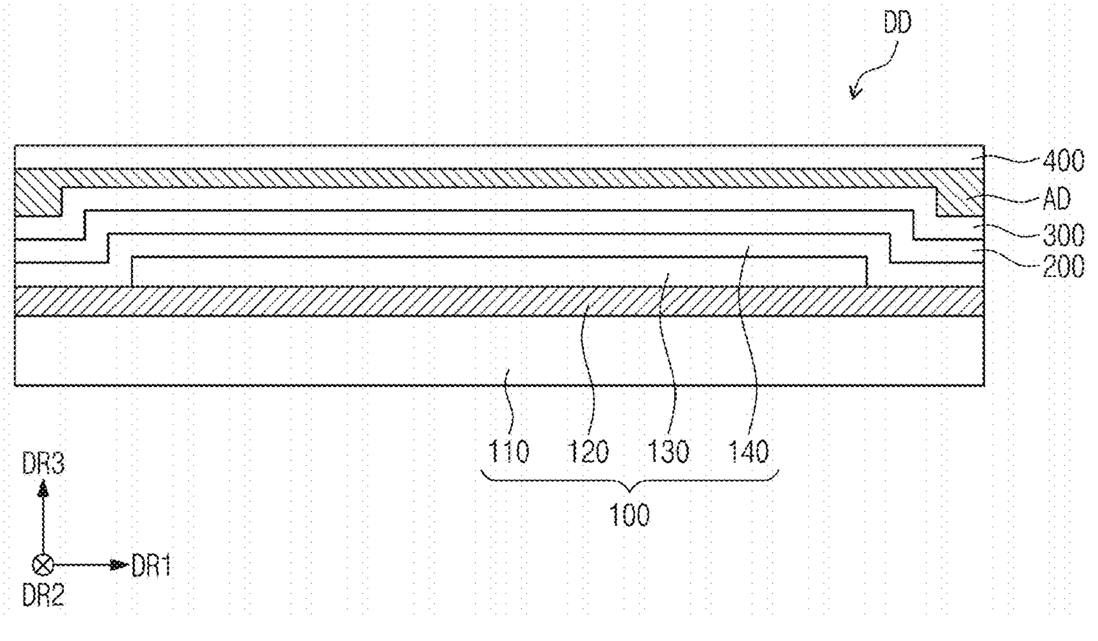
FIG. 3 is a cross-sectional view of a display device according to an embodiment of the inventive concept.

FIG. 3 is a cross-sectional view of a display device DD according to an embodiment of the inventive concept.

Referring to FIG. 3, the display device DD may include a display panel 100, a sensor layer 200, an anti-reflection layer 300, and a window 400. The anti-reflection layer 300 and the window 400 may be bonded to each other by an adhesive layer AD.

The display panel 100 may generate an image. The display panel 100 may be an emission-type display panel. For example, the display panel 100 may be an organic light-emitting display panel, an inorganic light-emitting display panel, a quantum-dot display panel, a micro-LED display panel, or a nano-LED display panel. The display panel 100 may be referred to as a display layer.

The display panel 100 may include a base substrate 110, a circuit layer 120, a light-emitting element layer 130, and an encapsulation layer 140. The base substrate 110 may provide a base surface on which the circuit layer 120 is disposed. The base substrate 110 may overlap a display region DP-A and a non-display region DP-NA in FIG. 4. The base substrate 110 may be a rigid substrate, or a flexible substrate capable of bending, folding, rolling, and the like. The base substrate 110 may be a glass substrate, a metal substrate, a polymer substrate, or the like. However, an embodiment of the inventive concept is not limited thereto, and the base substrate 110 may be an inorganic layer, an organic layer, or a composite material layer.

The circuit layer 120 may be disposed on the base substrate 110. The circuit layer 120 may include an insulation layer, a semiconductor pattern, a conductive pattern, a signal line, and the like. The insulation layer, a semiconductor layer, and a conductive layer may be formed on the base substrate 110 through coating, deposition, and the like. After forming the insulation layer, the semiconductor layer, and the conductive layer, the insulation layer, the semiconductor layer, and the conductive layer may be selectively patterned through a plurality of cycles of a photolithography process. After this, the semiconductor pattern, the conductive pattern, and the signal line may be formed.

The light-emitting element layer 130 may be disposed on the circuit layer 120.

The light-emitting element layer 130 may include a light-emitting element. For example, the light-emitting element may include an organic light-emitting material, an inorganic light-emitting material, an organic-inorganic light-emitting material, quantum dots, quantum rods, a micro-LED, or a nano-LED.

The encapsulation layer 140 may be disposed on the light-emitting element layer 130. The encapsulation layer 140 may protect the light-emitting element layer 130 from moisture, oxygen, and foreign substances such as dust particles. The encapsulation layer 140 may include at least one inorganic layer. The encapsulation layer 140 may include a stacked structure of inorganic layer/organic layer/inorganic layer.

The sensor layer 200 may be disposed on the display panel 100. The sensor layer 200 may detect an external input applied from the outside. The external input may be a user's input. The user's input may include various types of external inputs such as a part of the user's body, light, heat, a pen, or pressure.

The sensor layer 200 may be formed on the display panel 100 through a continuous process. The sensor layer 200 may be directly disposed on the display panel 100. For example, a separate adhesive member may not be disposed between the sensor layer 200 and the display panel 100. However, an embodiment of the inventive concept is not limited thereto, and the sensor layer 200 may be bonded to the display panel 100 through an adhesive member. The adhesive member may include a common adhesive or a gluing agent.

The anti-reflection layer 300 may be directly disposed on the sensor layer 200. The anti-reflection layer 300 may reduce the reflectance of external light incident from the outside of the display device DD. The anti-reflection layer 300 may be formed on the sensor layer 200 through a continuous process. The anti-reflection layer 300 may include color filters. In addition, the anti-reflection layer 300 may further include a black matrix disposed adjacent to the color filters. Detailed configuration of the anti-reflection layer 300 will be described later.

The anti-reflection layer 300 according to an embodiment of the inventive concept is not limited to the above configuration, and may include a retarder and a polarizer for reducing the reflectance of external light. The retarder and the polarizer may be provided in a single polarizing film. The anti-reflection layer 300 may further include a protection film disposed above or under the polarizing film.

According to an embodiment of the inventive concept, the sensor layer 200 may be omitted. In this case, the anti-reflection layer 300 may be directly disposed on the display panel 100. According to an embodiment of the inventive concept, the positions of the sensor layer 200 and the anti-reflection layer 300 may be switched. For example, the anti-reflection layer 300 may be disposed between the display panel 100 and the sensor layer 200.

Although not illustrated in the drawing, according to an embodiment of the inventive concept, the display device DD may further include an optical layer disposed on the anti-reflection layer 300. The optical layer may be formed on the anti-reflection layer 300 through a continuous process.

The optical layer may control a direction of light incident from the display panel 100, and improve the frontal brightness of the display device DD. For example, the optical layer may include an organic insulation layer in which openings are defined respectively corresponding to light-emitting regions of pixels included in the display panel 100, and a high-refractive layer covering the organic insulation layer and filled in the openings. The high-refractive layer may have a higher refractive index than the organic insulation layer.

The window 400 may provide a front surface of the electronic device 1000 (see FIG. 1). The window 400 may protect the display panel 100, the sensor layer 200, and the anti-reflection layer 300. The window 400 may include a glass film or a synthetic resin film. The window 400 may further include a bezel pattern overlapping a non-display region DP-NA (see FIG. 4) of the display panel 100.

Figure 4:
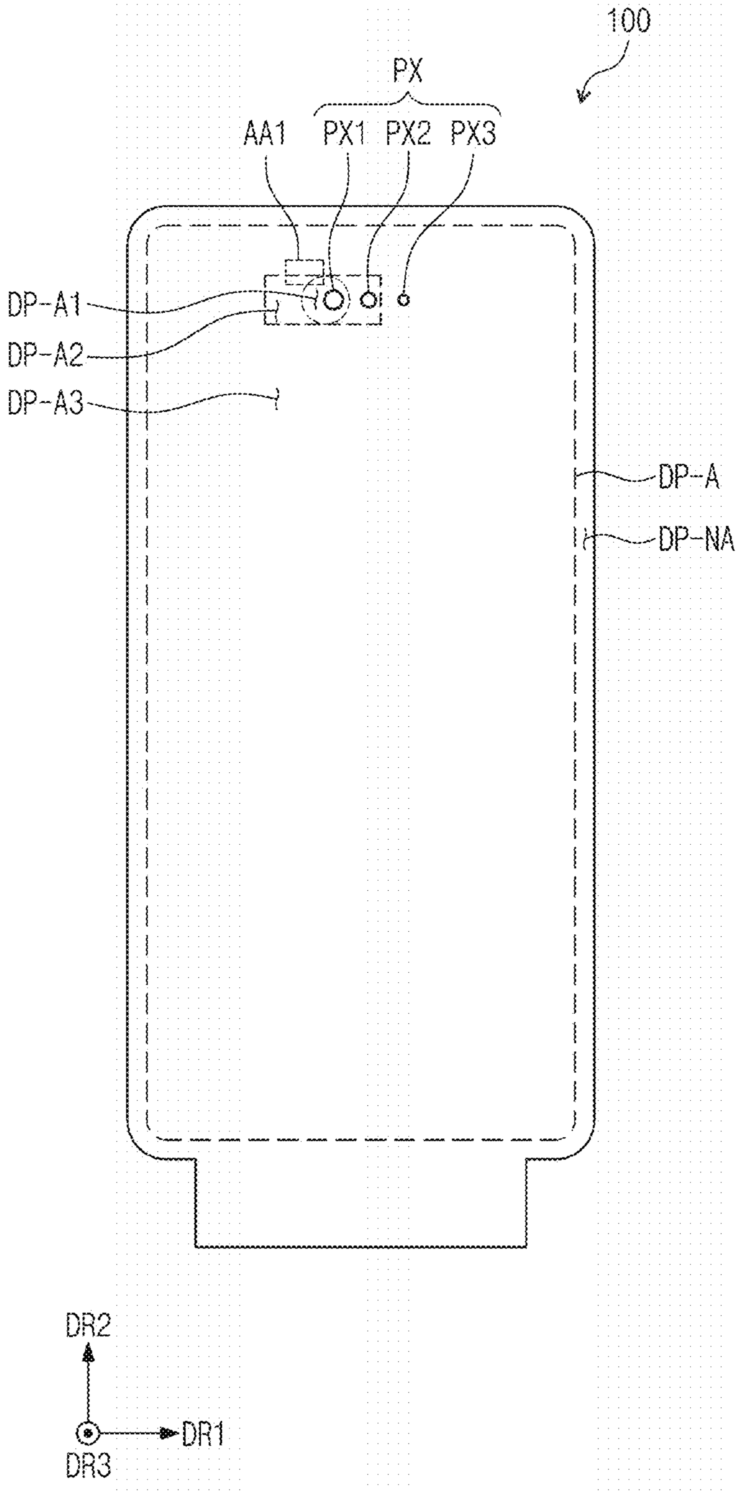
FIG. 4 is a plan view of a display panel according to an embodiment of the inventive concept.
Figure 5:
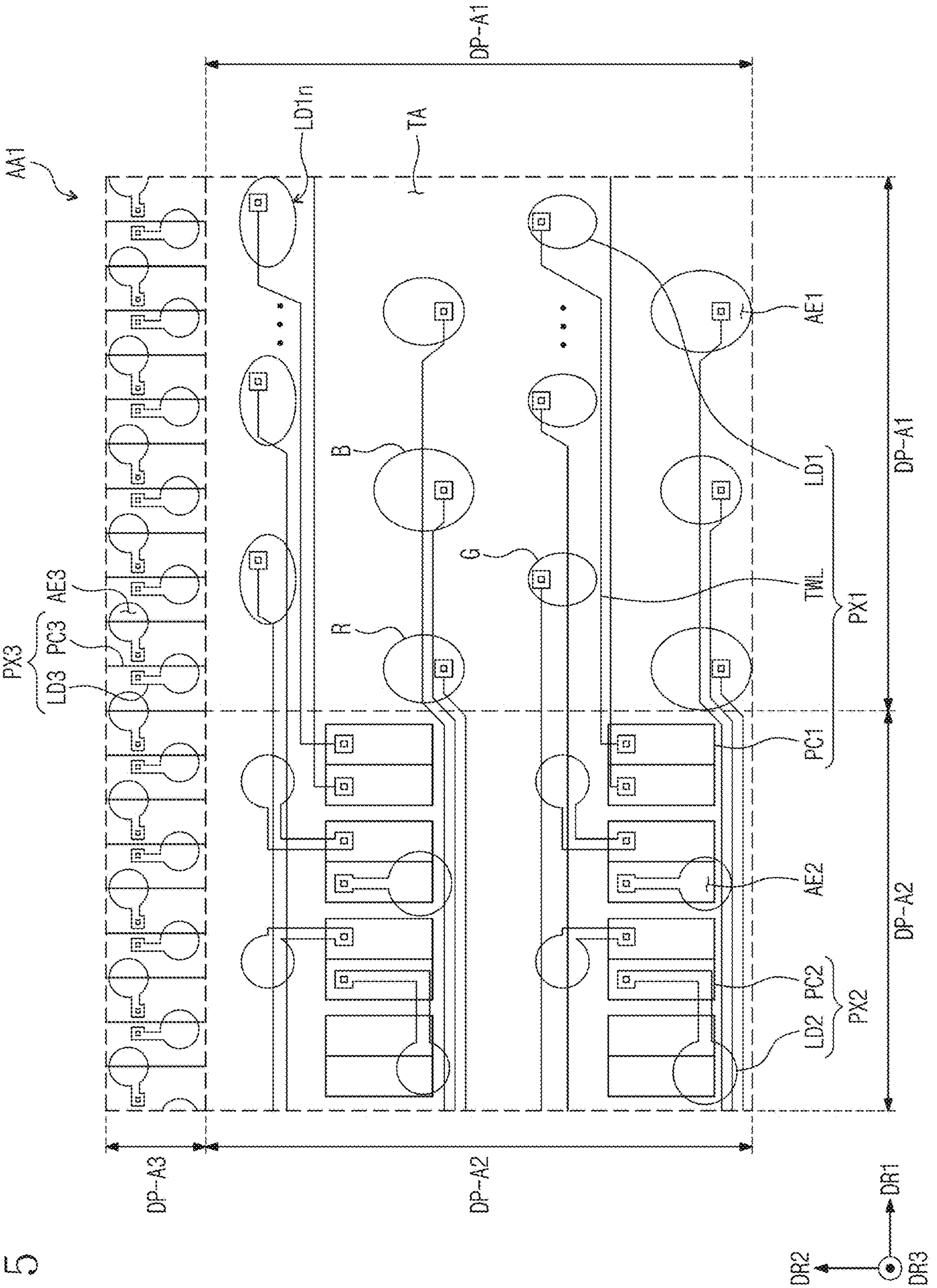
FIG. 5 is an enlarged plan view illustrating AA1 of FIG. 4.

FIG. 4 is a plan view of a display panel 100 according to an embodiment of the inventive concept. FIG. 5 is an enlarged plan view illustrating AA1 of FIG. 4.

Referring to FIGS. 4 and 5, the display panel 100 may include a display region DP-A and a non-display region DP-NA. The non-display region DP-NA may be disposed adjacent to the display region DP-A, and may surround at least a portion of the display region DP-A.

The display region DP-A may include a first region DP-A1, a second region DP-A2, and a third region DP-A3. The first region DP-A1 may be referred to as a component region, the second region DP-A2 may be referred to as a middle region or a transition area, and the third region DP-A3 may be referred to as a main display region or a general display region. The first region DP-A1 and the second region DP-A2 may also be referred to as an auxiliary display region.

The display panel 100 may include a plurality of pixels PX. The plurality of pixels PX may include a first pixel PX1 that emits light in the first region DP-A1, a second pixel PX2 that emits light in the second region DP-A2, and a third pixel PX3 that emits light in the third region DP-A3.

The first pixel PX1, the second pixel PX2, and the third pixel PX3 may each be provided in plurality. In this case, the first to third pixels PX1, PX2, and PX3 may include red pixels, green pixels, and blue pixels, respectively, and according to an embodiment, white pixels may further be included.

The first pixel PX1 may include a first light-emitting element LD1 and a first pixel circuit PC1 which is connected to the first light-emitting element LD1 and drives the first light-emitting element LD1. The second pixel PX2 may include a second light-emitting element LD2 and a second pixel circuit PC2 which is connected to the second light-emitting element LD2 and drives the second light-emitting element LD2. The third pixel PX3 may include a third light-emitting element LD3 and a third pixel circuit PC3 which is connected to the third light-emitting element LD3 and drives the third light-emitting element LD3.

FIG. 4 illustrates that the positions of the first pixel PX1, the second pixel PX2, and the third pixel PX3 correspond to the positions of the first, second, and third light-emitting elements LD1, LD2, and LD3, respectively.

The first region DP-A1 may overlap or correspond to the sensing region 1000SA illustrated in FIG. 1. That is, the first region DP-A1 may be a region overlapping the electronic module CM (see FIG. 2) in a plan view. For example, an external input (for example, light) may be provided to the electronic module CM through the first region DP-A1, and an output from the electronic module CM may be emitted to the outside through the first region DP-A1.

In this embodiment, the first region DP-A1 is illustrated as a circle. However, the first region DP-A1 may have various shapes such as a polygon, an oval, a figure having at least one curved side, an atypical shape, or the like, and is not limited to any one embodiment of the inventive concept.

In order to secure the area of a transmission region TA, fewer pixels may be provided to the first region DP-A1 than to the third region DP-A3. A region, of the first region DP-A1, where the first light-emitting element LD1 is not disposed may be defined as the transmission region TA. The transmission region TA is illustrated on a cross-section in FIG. 7B.

The number of first pixels PX1 disposed in the first region DP-A1 in a unit area may be less than the number of third pixels PX3 disposed in the third region DP-A3 in the unit area. For example, the first region DP-A1 may have a resolution $\frac{1}{2}$, $\frac{3}{8}$, $\frac{1}{3}$, $\frac{1}{4}$, $\frac{2}{9}$, $\frac{1}{8}$, $\frac{1}{9}$, $\frac{1}{16}$, etc. of that of the third region DP-A3. In particular, the resolution of the third region DP-A3 may be about 400 ppi or more, and the resolution of the first region DP-A1 may be about 200 ppi or about 100 ppi. However, this is only an example, and an embodiment of the inventive concept is not limited particularly thereto.

The first pixel circuit PC1 of the first pixel PX1 may not be disposed in the first region DP-A1. For example, the first pixel circuit PC1 may be disposed in the second region DP-A2 or in the third region DP-A3. In this case, the light transmittance of the first region DP-A1 may be further increased than in the case where the first pixel circuit PC1 is disposed in the first region DP-A1.

The first light-emitting element LD1 and the first pixel circuit PC1 may be electrically connected to each other through a connection line TWL. The connection line TWL may overlap the transmission region TA of the first region DP-A1.

The connection line TWL may be disposed between a first pixel electrode AE1 and a back metal layer BML (see FIG. 7B) in the first region DP-A1, and connected to the first pixel electrode AE1. The connection line TWL may extend to the second region DP-A2 to be connected to the first pixel circuit PC1. The connection line TWL may be connected to the first pixel electrode AE1 of the first light-emitting element LD1 in the first region DP-A1, and may be connected to the first pixel circuit PC1 in the second region DP-A2.

The connection line TWL may include a transparent conductive line. The transparent conductive line may include a transparent conductive material or a light-transmissive material. For example, the connection line TWL may be formed of a transparent conductive oxide (TCO) film such as an indium tin oxide (ITO) film, an indium zinc oxide (IZO) film, an indium gallium zinc oxide (IGZO) film, a zinc oxide (ZnO) film, an indium oxide ($In_2O_3$) film, or the like.

The second region DP-A2 may be disposed adjacent to the first region DP-A1. The second region DP-A2 may surround at least a portion of the first region DP-A1. The second region DP-A2 may be a region having a lower transmittance than the first region DP-A1. In this embodiment, the second region DP-A2 may be spaced apart from the non-display region DP-NA. However, an embodiment of the inventive concept is not limited thereto, and the second region DP-A2 may be disposed adjacent to the non-display region DP-NA.

The first pixel circuit PC1 of the first pixel PX1, the second light-emitting element LD2, and the second pixel circuit PC2 may be disposed in the second region DP-A2. Therefore, the light transmittance of the second region DP-A2 may be lower than the light transmittance of the first region DP-A1.

Since the first pixel circuit PC1 of the first pixel PX1 is disposed in the second region DP-A2, the number of second pixels PX2 disposed in the second region DP-A2 in the unit area may be less than the number of third pixels PX3 disposed in the third region DP-A3 in the unit area. An image displayed in the second region DP-A2 may have a lower resolution than an image displayed in the third region DP-A3.

The third region DP-A3 may be disposed adjacent to the second region DP-A2. The third region DP-A3 may be defined as a region having a lower transmittance than the first region DP-A1. The third light-emitting element LD3 and the third pixel circuit PC3 may be disposed in the third region DP-A3.

The first light-emitting element LD1 may have an oval shape the width of which is larger in a second direction DR2 than in a first direction DR1. However, in order to secure the distance from the third light-emitting element LD3 disposed in the third region DP-A3, the first light-emitting element LD1, disposed most adjacent to the third region DP-A3, may have an oval shape the width of which is larger in the first direction DR1 than in the second direction DR2. The second and third light-emitting elements LD2 and LD3 may each have a circle shape.

The first light-emitting element LD1, the second light-emitting element LD2, and the third light-emitting element LD3 may be respectively provided in plurality to the first region DP-A1, the second region DP-A2, and the third region DP-A3.

The distance between first light-emitting elements LD1 adjacent to each other among the first light-emitting elements LD1 may be larger than the distance between third light-emitting elements LD3 adjacent to each other among the third light-emitting elements LD3. The distance between second light-emitting elements LD2 adjacent to each other among the second light-emitting elements LD2 may be larger than the distance between the third light-emitting elements LD3 adjacent to each other among the third light-emitting elements LD3.

The first, second, and third light-emitting elements LD1, LD2, and LD3 illustrated in FIG. 5 may correspond to shapes, in a plan view, of the first pixel electrode AE1 (see FIG. 7B) of the first light-emitting element LD1, the second pixel electrode AE2 (see FIG. 7B) of the second light-emitting element LD2, and the third pixel electrode AE3 (see FIG. 7A) of the third light-emitting element LD3, respectively.

In a plan view, the area of the first pixel electrode AE1 may be larger than the area of the second pixel electrode AE2. In addition, in a plan view, the area of the second pixel electrode AE2 may be larger than the area of the third pixel electrode AE3.

The first light-emitting elements LD1 disposed in the first region DP-A1 may include green light-emitting elements G disposed in an even row, red light-emitting elements R disposed in an odd row, and blue light-emitting elements B disposed alternately with the red light-emitting elements R in the odd row. The rows may extend to the first direction DR1. The green light-emitting elements G disposed in the even row and the red and blue light-emitting elements R and B disposed in the odd row may be arranged in a staggered manner.

Figure 6:
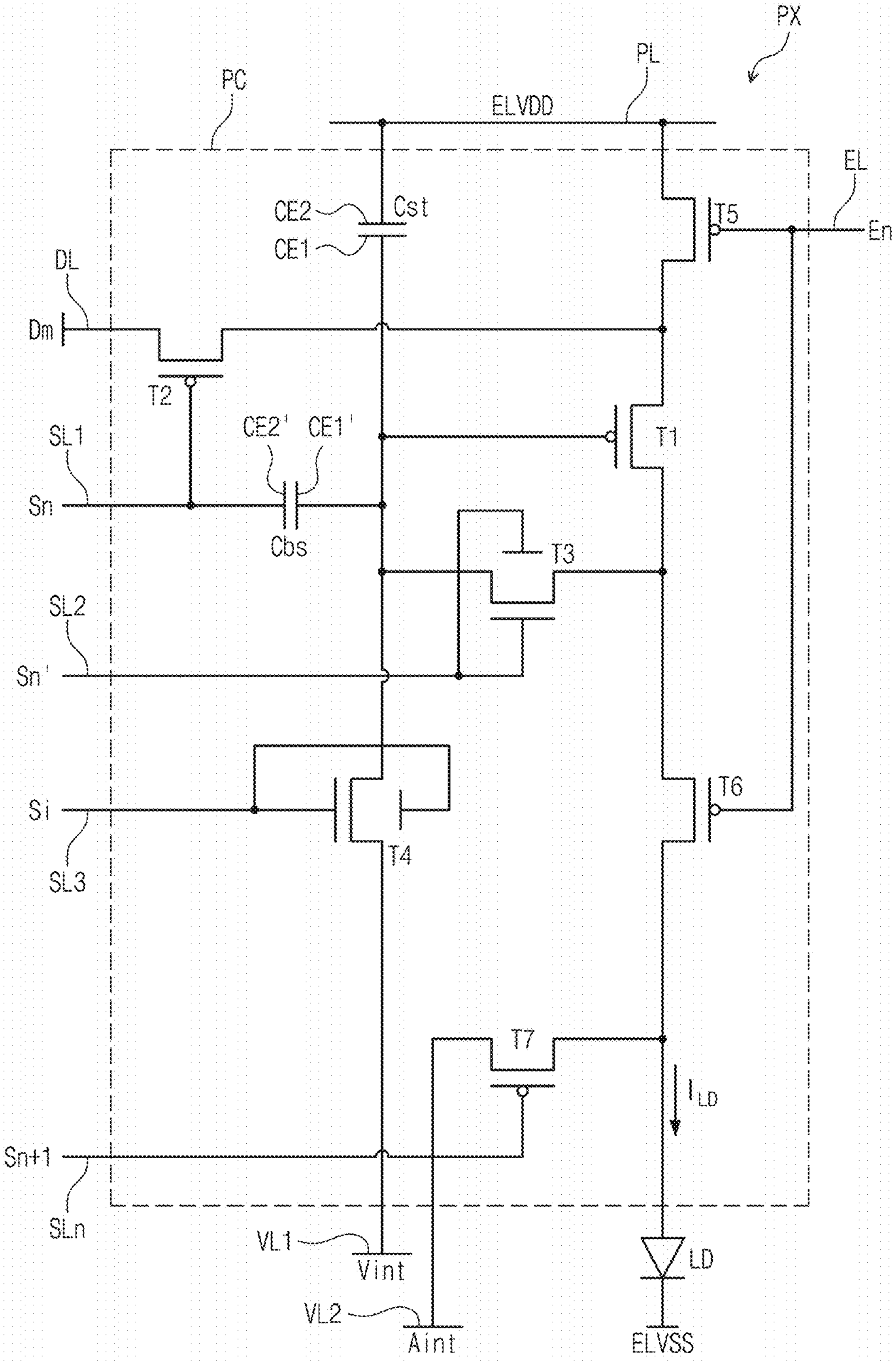
FIG. 6 is an equivalent circuit diagram of a pixel according to an embodiment of the inventive concept.

FIG. 6 is an equivalent circuit diagram of a pixel PX according to an embodiment of the inventive concept.

In FIG. 6, an equivalent circuit diagram of a pixel PX among a plurality of pixels PX is illustrated. The pixel PX illustrated in FIG. 6 may be the first pixel PX1 (see FIG. 4), the second pixel PX2 (see FIG. 4), or the third pixel PX3 (see FIG. 4).

The pixel PX may include a light-emitting element LD and a pixel circuit PC. The light-emitting element LD may be a component included in the light-emitting element layer 130 in FIG. 3, and the pixel circuit PC may be a component included in the circuit layer 120 in FIG. 3. In addition, the light-emitting elements LD may correspond to the first, second, and third light-emitting elements LD1, LD2, and LD3 illustrated in FIG. 5, respectively, and the pixel circuits PC may correspond to the first, second, and third pixel circuits PC1, PC2, and PC3 illustrated in FIG. 5, respectively.

The pixel circuit PC may include a plurality of transistors T1, T2, T3, T4, T5, T6, and T7 and a storage capacitor Cst. The plurality of transistors T1, T2, T3, T4, T5, T6, and T7 and the storage capacitor Cst may be electrically connected to signal lines SL1, SL2, SL3, SLn, EL, and DL, a first initialization voltage line VL1, a second initialization voltage line VL2 (or anode initialization voltage line), and a driving voltage line PL. In an embodiment, at least one of the aforementioned lines, for example, the driving voltage line PL, may be shared among the pixels PX.

The plurality of transistors T1, T2, T3, T4, T5, T6, and T7 may include a driving transistor T1, a switching transistor T2, a compensation transistor T3, a first initialization transistor T4, an operation control transistor T5, an emission control transistor T6, and a second initialization transistor T7.

The light-emitting element LD may include a lower electrode (for example, anode electrode or pixel electrode), an upper electrode (for example, cathode electrode or common electrode), and a light emitting layer disposed between the lower electrode and the upper electrode, The lower electrode of the light-emitting element LD may be connected to the driving transistor T1 through the emission control transistor T6, and may receive a driving current ILD. The upper electrode of the light-emitting element LD may receive a low power supply voltage ELVSS. The light-emitting element LD may generate light of brightness corresponding to the driving current ILD.

Some of the plurality of transistors T1, T2, T3, T4, T5, T6, and T7 may be n-channel MOSFETs (NMOS), and others may be p-channel MOSFETs (PMOS). For example, the compensation transistor T3 and the first initialization transistor T4, among the plurality of transistors T1, T2, T3, T4, T5, T6, and T7, may be n-channel MOSFETs (NMOS), and the others may be p-channel MOSFETs (PMOS).

In another embodiment, the compensation transistor T3, the first initialization transistor T4, and the second initialization transistor T7, among the plurality of transistors T1, T2, T3, T4, T5, T6, and T7, may be NMOS, and the others may be PMOS. Alternatively, only one of the plurality of transistors T1, T2, T3, T4, T5, T6, and T7 may be an NMOS, and the others may be PMOS. Alternatively, all of the plurality of transistors T1, T2, T3, T4, T5, T6, and T7 may be either NMOS or PMOS.

The signal lines may include a first scan line SL1 that transmits a first scan signal Sn, a second scan line SL2 that transmits a second scan signal Sn', a third scan line SL3 that transmits a third scan signal S1 to the first initialization transistor T4, an emission control line EL that transmits an emission control signal En to the operation control transistor T5 and the emission control transistor T6, a next scan line SLn that transmits a next scan signal Sn+1 to the second initialization transistor T7, and a data line DL that transmits a data signal Dm while crossing the first scan line SL1.

The first scan signal Sn may be a present scan signal, and the next scan signal Sn+1 may be a scan signal next to the first scan signal Sn.

The driving voltage line PL may transmit a driving voltage ELVDD to the driving transistor T1, and the first initialization voltage line VL1 may transmit an initialization voltage Vint, which initializes the pixel electrode, to the driving transistor T1.

A driving gate electrode of the driving transistor T1 may be connected to a first electrode of the storage capacitor Cst, a driving source region of the driving transistor T1 may be connected to the driving voltage line PL via the operation control transistor T5, and a driving drain region of the driving transistor T1 may be electrically connected to the first electrode of the light-emitting element LD via the emission control transistor T6.

The driving transistor T1 may receive the data signal Dm according to a switching operation of the switching transistor T2, and supply the driving current ILD to the light-emitting element LD.

A switching gate electrode of the switching transistor T2 may be connected to the first scan line SL1 that transmits the first scan signal Sn, a switching source region of the switching transistor T2 may be connected to the data line DL, and a switching drain region of the switching transistor T2 may be connected to the driving voltage line PL via the operation control transistor T5 while connected to the driving source region of the driving transistor T1.

The switching transistor T2 may be turned on in response to the first scan signal Sn transmitted through the first scan line SL1, and may perform a switching operation of transmitting the data signal Dm, which is supplied from the data line DL, to the driving source region of the driving transistor T1.

A compensation gate electrode of the compensation transistor T3 is connected to the second scan line SL2. A compensation drain region of the compensation transistor T3 may be connected to the pixel electrode of the light-emitting element LD via the emission control transistor T6 while connected to the driving drain region of the driving transistor T1.

A compensation source region of the compensation transistor T3 may be connected to the first electrode Cst1 of the storage capacitor Cst and the driving gate electrode of the driving transistor T1. In addition, the compensation source region may be connected to a first initialization drain region of the first initialization transistor T4.

The compensation transistor T3 may be turned on in response to the second scan signal Sn' transmitted through the second scan line SL2, and may electrically connect the driving gate electrode and the driving drain region of the driving transistor T1 so that the driving transistor T1 is diode-connected.

A first initialization gate electrode of the first initialization transistor T4 may be connected to the third scan line SL3. A first initialization source region of the first initialization transistor T4 may be connected to the first initialization voltage line VL1.

A first initialization drain region of the first initialization transistor T4 may be connected to the first electrode Cst1 of the storage capacitor Cst, the compensation source region of the compensation transistor T3, and the driving gate electrode of the driving transistor T1.

The first initialization transistor T4 may be turned on in response to the third scan signal Si transmitted through the third scan line SL3 to transmit the initialization voltage Vint to the driving gate electrode of the driving transistor T1, and may perform an initialization operation of initializing the voltage of the driving gate electrode of the driving transistor T1.

An operation control gate electrode of the operation control transistor T5 may be connected to the emission control line EL, an operation control source region of the operation control transistor T5 may be connected to the driving voltage line PL, and an operation control drain region of the operation control transistor T5 may be connected to the driving source region of the driving transistor T1 and the switching drain region of the switching transistor T2.

An emission control gate electrode of the emission control transistor T6 may be connected to the emission control line EL, an emission control source region of the emission control transistor T6 may be connected to the driving drain region of the driving transistor T1 and the compensation drain region of the compensation transistor T3, and an emission control drain region of the emission control transistor T6 may be electrically connected to a second initialization drain region of the second initialization transistor T7 and the pixel electrode of the light-emitting element LD.

The operation control transistor T5 and the emission control transistor T6 may be simultaneously turned on in response to the emission control signal En transmitted through the emission control line EL, and thus the driving voltage ELVDD may be transmitted to the light-emitting element LD, so that the driving current ILD may flow through the light-emitting element LD.

A second initialization gate electrode of the second initialization transistor T7 may be connected to the next scan line SLn, a second initialization drain region of the second initialization transistor T7 may be connected to the emission control drain region of the emission control transistor T6 and the pixel electrode of the light-emitting element LD, a second initialization source region of the second initialization transistor T7 may be connected to the second initialization voltage line VL2, and may thus receive an anode initialization voltage Aint therethrough.

The second initialization transistor T7 may be turned on in response to the next scan signal Sn+1 transmitted through the next scan line SLn, and may initialize the pixel electrode of the light-emitting element LD.

In another embodiment, the second initialization transistor T7 may be connected to the emission control line EL, and operated in response to the emission control signal En. Meanwhile, the positions of the source regions and the positions of the drain regions may be switched according to the type of the transistor (p-type or n-type).

The storage capacitor Cst may include a first electrode CE1 and a second electrode CE2. The first electrode CE1 of the storage capacitor Cst may be connected to the driving gate electrode of the driving transistor T1, and the second electrode CE2 of the storage capacitor Cst may be connected to the driving voltage line PL. The storage capacitor Cst may store electric charges corresponding to the difference between a driving gate electrode voltage of the driving transistor T1 and the driving voltage ELVDD.

A boosting capacitor Cbs may include a first electrode CE1' and a second electrode CE2'. The first electrode CE1' of the boosting capacitor Cbs may be connected to the first electrode CE1 of the storage capacitor Cst, and the second electrode CE2' of the boosting capacitor Cbs may receive the first scan signal Sn. The boosting capacitor Cbs may increase a voltage at a gate terminal of the driving transistor T1 at the time of discontinuation of the first scan signal Sn, and may thus compensate for voltage drop at the gate terminal of the driving transistor T1.

A detailed operation of the pixel PX according to an embodiment is as follows.

During initialization, when the third scan signal Si is provided through the third scan line SL3, the first initialization transistor T4 may be turned on in response to the third scan signal Si, and the driving transistor T1 may be initialized by the initialization voltage Vint supplied through the first initialization voltage line VL1.

During data programming, when the first scan signal Sn and the second scan signal Sn' are supplied through the first scan line SL1 and the second scan line SL2, the switching transistor T2 and the compensation transistor T3 may be turned on in response to the first scan signal Sn and the second scan signal Sn'. At this time, the driving transistor T1 may be diode-connected by the turned-on compensation transistor T3, and may be biased forward.

Then, a compensation voltage Dm+Vth (Vth is a (−) value), which is decreased by a threshold voltage (Vth) of the driving transistor T1 from the data signal Dm transmitted through the data line DL, may be applied to the driving gate electrode of the driving transistor T1.

The driving voltage ELVDD and the compensation voltage Dm+Vth may be applied to both ends of the storage capacitor Cst, and electric charges corresponding to the voltage difference between both of the ends may be stored in the storage capacitor Cst.

During emission, the operation control transistor T5 and the emission control transistor T6 may be turned on in response to the emission control signal En transmitted through the emission control line EL. The driving current ILD may be generated according to the difference between a driving gate electrode voltage of the driving transistor T1 and the driving voltage ELVDD, and the driving current ILD may be supplied to the light-emitting element LD through the emission control transistor T6.

In this embodiment, at least one of the plurality of transistors T1, T2, T3, T4, T5, T6, and T7 may include a semiconductor layer containing oxide, and others may include a semiconductor layer containing silicon.

In particular, the driving transistor T1, which directly affects the brightness of the display device, may be provided to include a semiconductor layer composed of polycrystalline silicon that is highly reliable, and accordingly, a high-resolution display device may be achieved.

Meanwhile, since an oxide semiconductor has high carrier mobility and a low leakage current, voltage drop may not be significant despite long operation time. That is, the color change of an image due to the voltage drop is not significant even during a low frequency operation. Therefore, the low frequency operation may be possible.

Since the oxide semiconductor has such an advantage of having a low leakage current, at least one of the compensation transistor T3, the first initialization transistor T4, and the second initialization transistor T7 connected to the driving gate electrode of the driving transistor T1 may be composed of the oxide semiconductor. Therefore, the leakage current may be prevented from flowing from the driving gate electrode, and at the same time, the power consumption may be reduced.

Figure 7A:
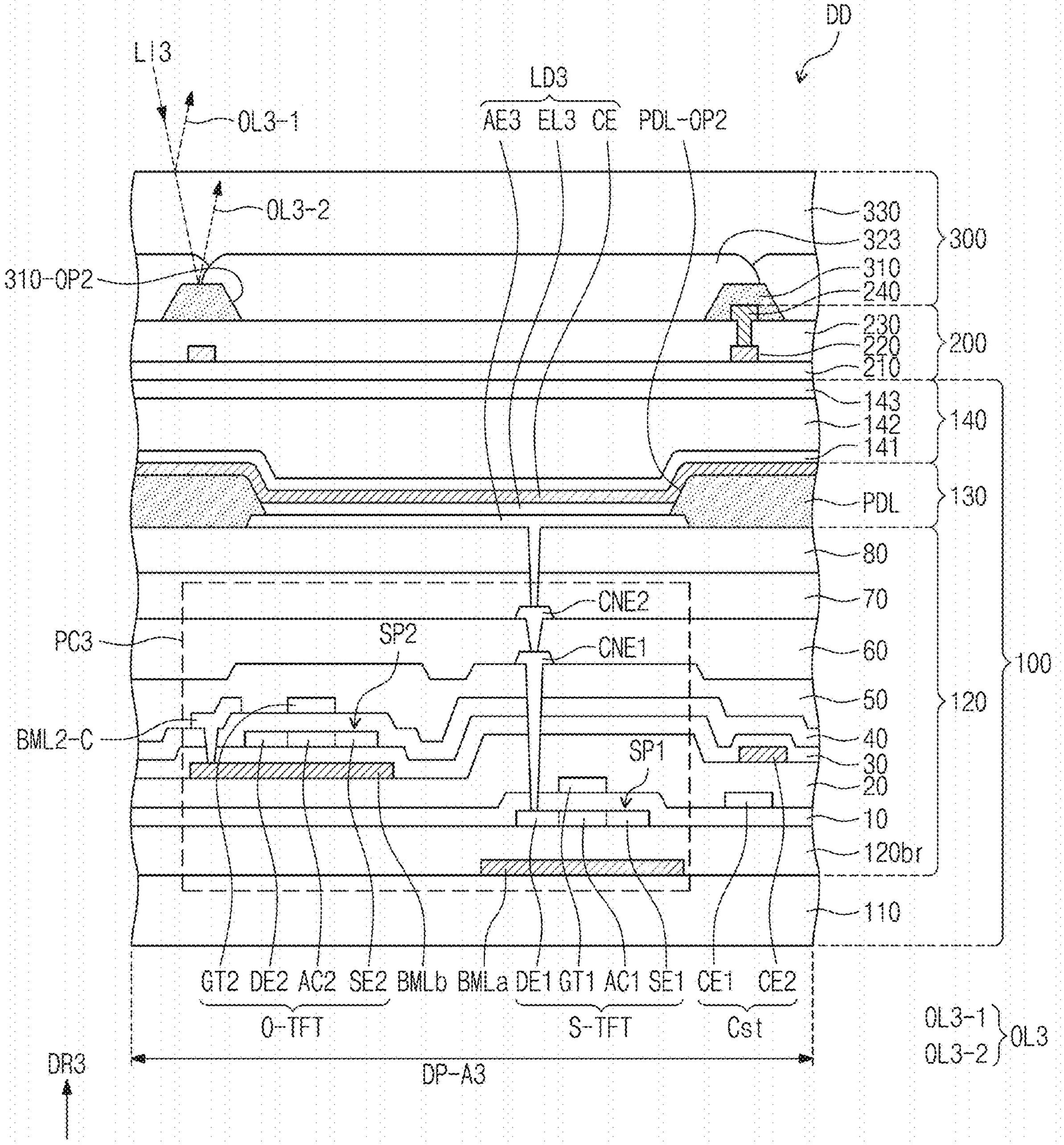
FIGS. 7A and 7B are cross-sectional views of a display device according to an embodiment of the inventive concept.
Figure 7B:
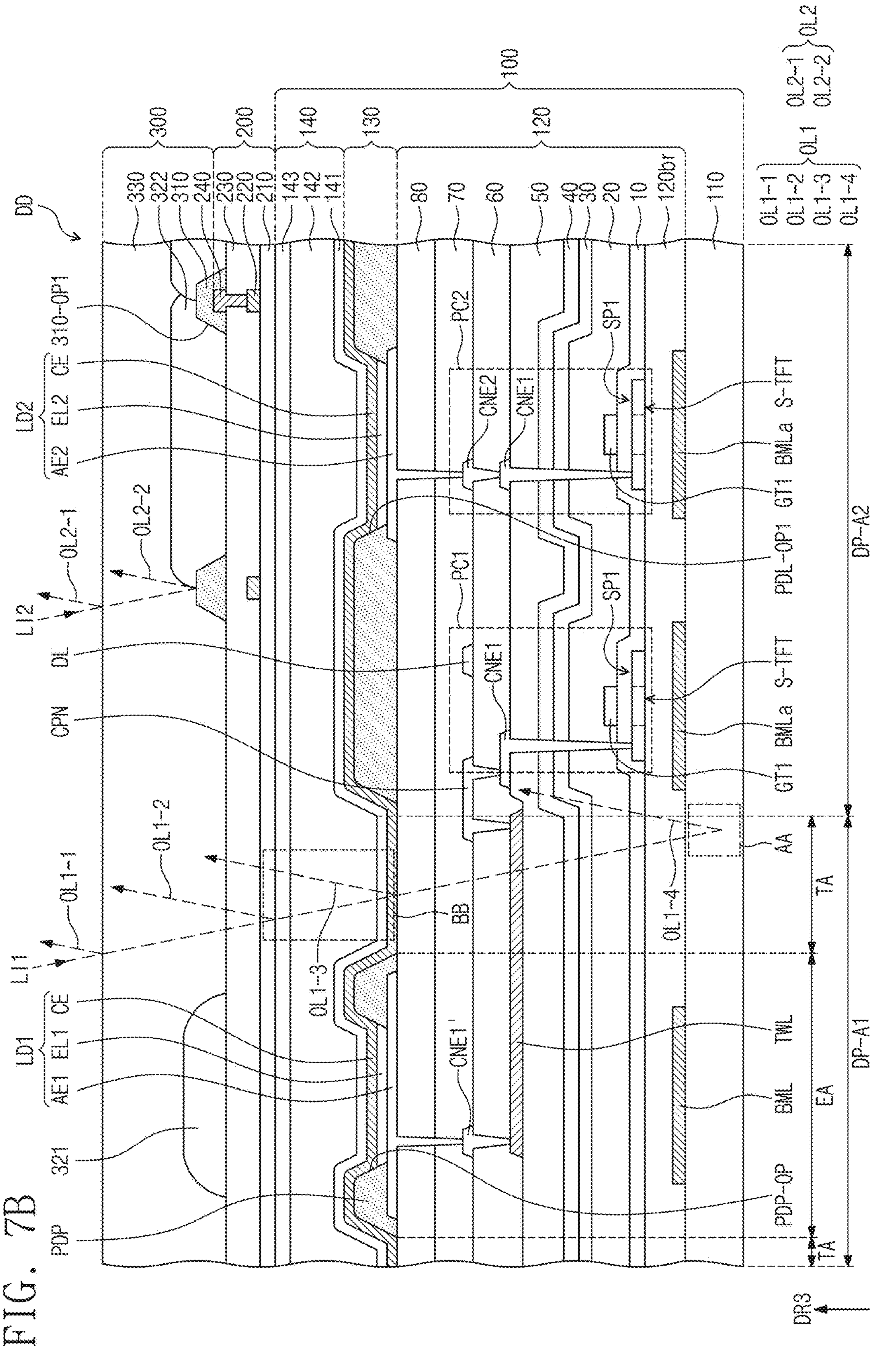

FIGS. 7A and 7B are cross-sectional views of a display device according to an embodiment of the inventive concept. More particularly, FIG. 7A is a cross-sectional view illustrating a portion including a third region DP-A3, and FIG. 7B is a cross-sectional view illustrating a portion including a first region DP-A1 and a second region DP-A2.

Referring to FIGS. 7A and 7B, FIG. 7A illustrates a third light-emitting element LD3, a silicon transistor S-TFT of a third pixel circuit PC3, and an oxide transistor O-TFT of the third pixel circuit PC3. FIG. 7B illustrates a first light-emitting element LD1, a first pixel circuit PC1, a second light-emitting element LD2, and a second pixel circuit PC2.

Figure 8A:
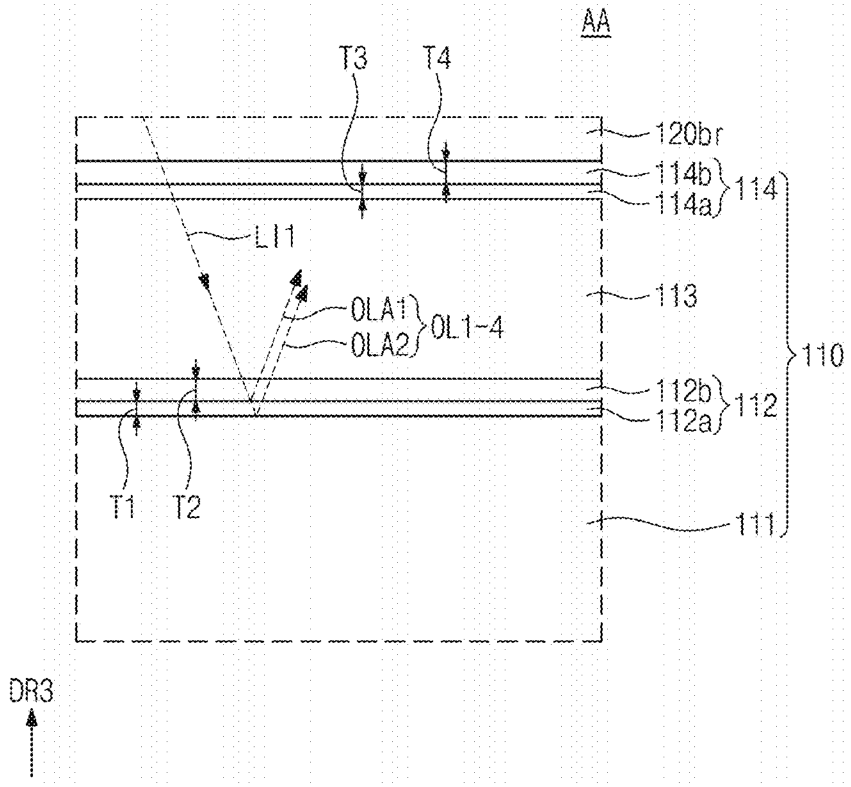
FIG. 8A is an enlarged cross-sectional view illustrating AA of FIG. 7B.

A base substrate 110 may be a substrate made of an insulating material for supporting various components of a display panel 100. The base substrate 110 may have a multi-layer structure including a first base layer 111, a first barrier layer 112, a second base layer 113, and a second barrier layer 114 as illustrated in FIG. 8A.

A buffer layer 120*br* may be disposed on the base substrate 110. The buffer layer 120*br* may prevent metal atoms or impurities from diffusing from the base substrate 110 to a first semiconductor pattern SP1. In addition, the buffer layer 120*br* may control the speed of providing heat during a crystallization process for forming the first semiconductor pattern SP1, so that the first semiconductor pattern SP1 may be formed uniformly.

A first back metal layer BMLa may be disposed under the silicon transistor S-TFT, and a second back metal layer BMLb may be disposed under the oxide transistor O-TFT. The silicon transistor S-TFT may be a transistor including the silicon-containing semiconductor layer previously described. The oxide transistor O-TFT may be a transistor including the oxide-containing semiconductor layer previously described.

The first and second back metal layers BMLa and BMLb may be disposed to overlap semiconductor patterns of the first to third pixel circuits PC1, PC2, and PC3.

The first and second back metal layers BMLa and BMLb may be disposed on the base substrate 110.

The first and second back metal layers BMLa and BMLb may prevent electric potential which is caused by a polarization phenomenon of the base substrate 110 from affecting the first to third pixel circuits PC1, PC2, and PC3. The first and second back metal layers BMLa and BMLb may prevent external light from reaching the semiconductor patterns of the first to third pixel circuits PC1, PC2, and PC3. The first and second back metal layers BMLa and BMLb may not be disposed in the first region DP-A1.

The first back metal layer BMLa may be disposed between the base substrate 110 and the buffer layer 120*br*. The first back metal layer BMLa may be connected to an electrode or a signal line, and may receive a constant voltage or a signal therefrom. According to an embodiment of the inventive concept, the first back metal layer BMLa may be a floating electrode which is isolated from another electrode or signal line.

The second back metal layer BMLb may be disposed between a second insulation layer 20 and a third insulation layer 30. The second back metal layer BMLb may be disposed on the same layer as a second electrode CE2 of the storage capacitor Cst. The second back metal layer BMLb may be connected to a contact electrode BML2-C to receive a constant voltage or a signal. The contact electrode BML2-C may be disposed on the same layer as a gate GT2 of the oxide transistor O-TFT.

The first back metal layer BMLa and the second back metal layer BMLb may each include reflective metal. The first back metal layer BMLa and the second back metal layer BMLb may include a same material or different materials.

The first back metal layer BMLa and the second back metal layer BMLb may each include silver (Ag), a silver-containing alloy, molybdenum (Mo), a molybdenum-containing alloy, aluminum (Al), an aluminum-containing alloy, aluminum nitride (AlN), tungsten (W), tungsten nitride (WN), copper (Cu), $p^+$ doped amorphous silicon, and the like.

Although not separately illustrated in the drawing, according to an embodiment of the inventive concept, the second back metal layer BMLb may be omitted. In this case, the first back metal layer BMLa may extend to a lower part of the oxide transistor O-TFT, and block light incident to the lower part of the oxide transistor O-TFT.

A back metal layer BML may be disposed under a first light-emitting element LD1. The back metal layer may be disposed between the base substrate 110 and the buffer layer 120*br*. The back metal layer BML may include the same material as the first back metal layer BMLa and the second back metal layer BMLb. The back metal layer BML may be disposed on the same layer as the first back metal layer BMLa, but an embodiment of the inventive concept is not limited thereto, and the back metal layer BML may be disposed on the same layer as the second back metal layer BMLb.

The first semiconductor pattern SP1 may be disposed on the buffer layer 120*br*. The first semiconductor pattern SP1 may include a silicon semiconductor. For example, the silicon semiconductor may include amorphous silicon, polycrystalline silicon, and the like. In particular, the first semiconductor pattern SP1 may include low temperature polysilicon.

FIGS. 7A and 7B illustrate a portion of the first semiconductor pattern SP1 disposed on the buffer layer 120*br*. The first semiconductor pattern SP1 may be further disposed in another region. The first semiconductor pattern SP1 may be arranged across the pixels PX according to a particular rule.

The first semiconductor pattern SP1 may have different electrical properties depending on whether it is doped or not. The first semiconductor pattern SP1 may include a first region having high conductivity and a second region having low conductivity. The first region may be doped with an N-type dopant or P-type dopant. A P-type transistor may include a doped region doped with a P-type dopant, and an N-type transistor may include a doped region doped with an N-type dopant. The second region may be an undoped region, or a doped region doped with lower concentration than the first region.

The conductivity of the first region may be higher than that of the second region, and the first region may substantially serve as an electrode or a signal line. The second region may substantially correspond to an active region (or channel) of a transistor. That is, a portion of the semiconductor pattern may be an active region, another portion may be a source or a drain of the transistor, and another portion may be a connection electrode or a connection signal line.

A source region SE1 (or source), an active region AC1 (or channel), and a drain region DE1 (or drain) of the silicon transistor S-TFT may be formed from the first semiconductor pattern SP1. The source region SE1 and the drain region DE1 may extend in opposite directions from the active region AC1 disposed therebetween in a cross-sectional view.

The first insulation layer 10 may be disposed on the buffer layer 120*br*. The first insulation layer 10 may overlap a plurality of pixel areas in common, and cover the first semiconductor pattern SP1. The first insulation layer 10 may be an inorganic layer.

A gate GT1 of the silicon transistor S-TFT may be disposed on the first insulation layer 10. The gate GT1 may be a portion of a metal pattern.

A second insulation layer 20 may be disposed on the first insulation layer 20, and cover the gate GT1. The second insulation layer 20 may be an inorganic layer. The third insulation layer 30 may be disposed on the second insulation layer 20. The third insulation layer 30 may be an inorganic layer.

The first electrode CE1 of the storage capacitor Cst may be disposed between the first insulation layer 10 and the second insulation layer 20. The second electrode CE2 of the storage capacitor Cst may be disposed between the second insulation layer and the third insulation layer 30.

A second semiconductor pattern SP2 may be disposed on the third insulation layer 30. The second semiconductor pattern SP2 may include an oxide semiconductor. The oxide semiconductor may include a plurality of regions distinguished according to whether a transparent conductive oxide is reduced or not. A region where the transparent conductive oxide is reduced (hereinafter, reduced region) has higher conductivity than a region where the transparent conductive oxide is unreduced (hereinafter, unreduced region).

The reduced region may substantially serve as a source, a drain or a signal line of a transistor. The unreduced region may substantially correspond to a semiconductor region (or active region or a channel) of the transistor. That is, a partial region of the second semiconductor pattern SP2 may be the semiconductor region of the transistor, another partial region may be a source region or a drain region of the transistor, and another partial region may be a signal transmission region.

The source region SE2, the active region AC2, and the drain region DE2 of the oxide transistor O-TFT may be formed from the second semiconductor pattern SP2. The source region SE2 and the drain region DE2 may extend in opposite directions from the active region AC2 disposed therebetween in a cross-sectional view.

A fourth insulation layer 40 may be disposed on the third insulation layer 30. The fourth insulation layer 40 may overlap the plurality of pixel areas in common, and cover the second semiconductor pattern SP2. The fourth insulation layer 40 may be an inorganic layer.

A gate GT2 of the oxide transistor O-TFT may be disposed on the fourth insulation layer 40. The gate GT2 may be a portion of a metal pattern. The gate GT2 may overlap the active region AC2.

A fifth insulation layer 50 may be disposed on the fourth insulation layer 40, and cover the gate GT2. The fifth insulation layer 50 may be an inorganic layer and/or an organic layer, and may have a single-layer or multi-layer structure.

A first connection electrode CNE1 may be disposed on the fifth insulation layer 50. The first connection electrode CNE1 may be connected to the drain region DE1 of the silicon transistor S-TFT through a contact hole formed through the first to fifth insulation layers 10, 20, 30, 40, and 50.

A sixth insulation layer 60 may be disposed on the fifth insulation layer 50. A second connection electrode CNE2 may be disposed on the sixth insulation layer 60.

The second connection electrode CNE2 may be connected to the first connection electrode CNE1 through a contact hole formed through the sixth insulation layer 60.

A seventh insulation layer 70 may be disposed on the sixth insulation layer 60, and may cover the second connection electrode CNE2. An eighth insulation layer 80 may be disposed on the seventh insulation layer 70. The sixth insulation layer 60, the seventh insulation layer 70, and the eighth insulation layer 80 may each be an organic layer.

Layers from the buffer layer 120*br* to the eighth insulation layer 80 may be constitute a circuit layer 120. A light-emitting element layer 130 which includes the first to third light-emitting elements LD1, LD2, and LD3 may be disposed on the eighth insulation layer 80.

The first light-emitting element LD1 may include a first pixel electrode AE1, a first light-emitting layer EL1, and a common electrode CE. The second light-emitting element LD2 may include a second pixel electrode AE2, a second light-emitting layer EL2, and the common electrode CE. The third light-emitting element LD3 may include a third pixel electrode AE3, a third light-emitting layer EL3, and the common electrode CE. The common electrode CE may have an integral shape, and may be provided to the first, second, and third pixels PX1, PX2, and PX3 in common. That is, the common electrode CE may be provided across the pixel areas in common.

The first pixel electrode AE1, the second pixel electrode AE2, and the third pixel electrode AE3 may be disposed on the eighth insulation layer 80. The first pixel electrode AE1, the second pixel electrode AE2, and the third pixel electrode AE3 may each be a (semi-) transparent electrode or reflective electrode.

The reflective electrode may be formed of Ag, Mg, Al, Pt, Pd, Au, Ni, Nd, Ir, Cr, or a compound thereof. The transparent or semi-transparent electrode may be formed of at least one of indium tin oxide (ITO), indium zinc oxide (IZO), indium gallium zinc oxide (IGZO), zinc oxide (ZnO) or indium oxide ($In_2O_3$), or aluminum-doped zinc oxide (AZO). For example, the first pixel electrode AE1, the second pixel electrode AE2, and the third pixel electrode AE3 may each be formed of ITO/Ag/ITO.

A pixel-defining film PDL and a pixel-defining pattern PDP may be disposed on the eighth insulation layer 80. The pixel-defining film PDL and the pixel-defining pattern PDP may include a same material, and may be formed through a same process.

The pixel-defining film PDL and the pixel-defining pattern PDP may each have light-absorbing characteristics. For example, the pixel-defining film PDL and the pixel-defining pattern PDP may each have a black color.

The pixel-defining pattern PDP may be disposed in the first region DP-A1. The pixel-defining pattern PDP may cover an edge of the first pixel electrode AE1. In a plan view, the pixel-defining pattern PDP may have a shape of a ring. In a plan view may mean when viewed from a third direction DR3. An opening PDP-OP that exposes a portion of the first pixel electrode AE1 may be defined in the pixel-defining pattern PDP.

The pixel-defining film PDL may be disposed in the second region DP-A2 and the third region DP-A3. The pixel-defining film PDL may cover an edge of each of the second pixel electrode AE2 and the third pixel electrode AE3. A first opening PDL-OP1 that exposes a portion of the second pixel electrode AE2 and a second opening PDL-OP2 that exposes a portion of the third pixel electrode AE3 may be defined in the pixel-defining film PDL.

A region of the first region DP-A1 overlapping a portion where the first pixel electrode AE1 and the pixel-defining pattern PDP are disposed may be defined as an element region EA, and a remaining region may be defined as a transmission region TA.

The first pixel electrode AE1 may be electrically connected to the first semiconductor pattern SP1 of the first pixel circuit PC1 disposed in the second region DP-A2. For example, the first pixel electrode AE1 may be electrically connected to the first semiconductor pattern SP1 of the first pixel circuit PC1 through a connection line TWL and a connection bridge CPN. The connection line TWL may be connected to the first pixel electrode AE1 in the first region DP-A1 and may extend to the second region DP-A2. The connection line TWL may overlap the transmission region TA. The connection line TWL may include a light-transmissive material.

The connection line TWL may be disposed between the fifth insulation layer 50 and the sixth insulation layer 60, but is not particularly limited thereto. The connection bridge CPN may be disposed between the sixth insulation layer 60 and the seventh insulation layer 70. The connection bridge CPN may be connected to the connection line TWL and the first semiconductor pattern SP1 of the first pixel circuit PC1 via the first connection electrode CNE1.

The first light-emitting layer EL1 may be disposed on the first pixel electrode AE1, the second light-emitting layer EL2 may be disposed on the second pixel electrode AE2, and the third light-emitting layer EL3 may be disposed on the third pixel electrode AE3. In this embodiment, the first to third light-emitting layers EL1, EL2, and EL3 may each emit light of at least one color of blue, red, or green color.

The common electrode CE may be disposed on the pixel-defining film PDL, the pixel-defining pattern PDP, and the first to third light-emitting layers EL1, EL2, and EL3. The common electrode CE may have an integral shape, and may be commonly disposed on the pixel-defining film PDL, the pixel-defining pattern PDP, and the first to third light-emitting layers EL1, EL2, and EL3.

The common electrode CE may be a light-transmissive electrode. In an embodiment, the common electrode CE may be a transparent or semi-transparent electrode, and may be formed of a thin metal film, with a small work function, containing Li, Ca, LiF/Ca, LiF/Al, Al, Ag, Mg, and a compound thereof. In addition, a film made of transparent conductive oxide (TCO), such as ITO, IZO, ZnO, $In_2O_3$, or the like, may be disposed on the thin metal film.

Although not illustrated in the drawing, a hole control layer may be disposed between the first to third pixel electrodes AE1, AE2, and AE3 and the first to third light-emitting layers EL1, EL2, and EL3. The hole control layer may include a hole transport layer and may further include a hole injection layer. An electron control layer may be disposed between the first to third light-emitting layers EL1, EL2, and EL3 and the common electrode CE. The electron control layer may include an electron transport layer and may further include an electron injection layer.

An encapsulation layer 140 may be disposed on the light-emitting element layer 130. The encapsulation layer 140 may cover the light-emitting elements LD1, LD2, and LD3. The encapsulation layer 140 may include a first inorganic layer 141, an organic layer 142, and a second inorganic layer 143 that are stacked in sequence, but the layers constituting the encapsulation layer 140 are not limited thereto. The inorganic layers 141 and 143 may protect the light-emitting element layer 130 from moisture and oxygen, and the organic layer 142 may protect the light-emitting element layer 130 from foreign substances such as dust particles.

A sensor layer 200 may be disposed on the display panel 100. The sensor layer 200 may be referred to as a sensor, an input-sensing layer, or an input-sensing panel. The sensor layer 200 may include a sensor base layer 210, a first conductive layer 220, a sensor insulation layer 230, and a second conductive layer 240.

The sensor base layer 210 may be directly formed on the display panel 100. The sensor base layer 210 may be an inorganic layer or organic layer. The sensor base layer 210 may have a single-layer structure, or have a structure of multiple layers stacked along the third direction DR3.

The first conductive layer 220 and the second conductive layer 240 may be formed on the sensor base layer 210. The sensing insulation layer 230 may be formed between the first conductive layer 220 and the second conductive layer 240. The sensor insulation layer 230 may include an inorganic layer or organic layer.

An anti-reflection layer 300 may be disposed on the sensor layer 200. The anti-reflection layer 300 may include a black matrix 310, a first color filter 321, a second color filter 322, a third color filter 323, and a planarization layer 330.

The black matrix 310 may have a black color. The black matrix 310 may cover the second conductive layer 240 of the sensor layer 200. The black matrix 310 may prevent external light reflection by the second conductive layer 240. The black matrix 310 may overlap the second region DP-A2 and the third region DP-A3, and may not overlap the first region DP-A1. Since the black matrix 310 is not disposed in the first region DP-A1, the transmittance may be further improved in the first region DP-A1.

A plurality of openings 310-OP1 and 310-OP2 may be defined in the black matrix 310. The first opening 310-OP1 may overlap the second pixel electrode AE2, and the second opening 310-OP2 may overlap the third pixel electrode AE3.

The first color filter 321 may be disposed in the first region DP-A1, the second color filter 322 may be disposed in the second region DP-A2, and the third color filter 323 may be disposed in the third region DP-A3. The first color filter 321 may overlap the first pixel electrode AE1 and may be disposed on the first light-emitting element LD1. The second color filter 322 may overlap the second pixel electrode AE2 and may be disposed on the second light-emitting element LD2. The third color filter 323 may overlap the third pixel electrode AE3 and may be disposed on the third light-emitting element LD3.

The first color filter 321 may not be in contact with the black matrix 310. The second color filter 322 may cover the first opening 310-OP1, and the third color filter 323 may cover the second opening 310-OP2. The second color filter 322 and the third color filter 323 may each be in contact with the black matrix 310. The areas of the first and second openings 310-OP1 and 310-OP2 of the black matrix 310 may be larger than the areas of the first and second openings PDL-OP1 and PDL-OP2 of the pixel-defining film PDL.

When external light travelling toward the display panel 100 is reflected on the display panel 100, and then provided back to a user toward the outside, the user may view the external light. To prevent this phenomenon, the first, second, and third color filters 321, 322, and 323 may display the same colors as the first, second, and third light-emitting elements LD1, LD2, and LD3, respectively. The color filters CFT may selectively transmit the same colors as the first, second, and third light-emitting elements LD1, LD2, and LD3, respectively. In this case, the external light may not be visible to the user.

The planarization layer 330 may cover the black matrix 310, the first color filter 321, the second color filter 322, and the third color filter 323. The planarization layer 330 may include an organic material, and the planarization layer 330 may provide a flat surface on the upper surface thereof. In an embodiment, the planarization layer 330 may be omitted.

FIG. 7A exemplarily illustrates third incident light LI3 as external light incident into the third region DP-A3 of the display device DD and third reflected light OL3 as light reflected outward in the third region DP-A3 of the display device DD. The third reflected light OL3 may include (3-1)-th reflected light OL3-1 reflected on the planarization layer 330, and (3-2)-th reflected light OL3-2 reflected on the black matrix 310. However, the third reflected light OL3 is not limited thereto, and may further include other reflected light in addition to the (3-1)-th reflected light OL3-1 and the (3-2)-th reflected light OL3-2.

FIG. 7B exemplarily illustrates second incident light LI2 as external light incident into the second region DP-A2 of the display device DD and second reflected light OL2 as light reflected outward in the second region DP-A2 of the display device DD. The second reflected light OL2 may include (2-1)-th reflected light OL2-1 reflected on the planarization layer 330 and (2-2)-th reflected light OL2-2 reflected on the black matrix 310. However, the second reflected light OL2 is not limited thereto, and may further include other reflected light in addition to the (2-1)-th reflected light OL2-1 and the (2-2)-th reflected light OL2-2.

First incident light LI1 is exemplarily illustrated as light incident from the outside into the first region DP-A1 of the display device DD, and first reflected light OL1 is exemplarily illustrated as light reflected outward in the first region DP-A1 of the display device DD. The first reflected light OL1 may include (1-1)-th reflected light OL1-1 reflected on the planarization layer 330, (1-2)-th reflected light OL1-2 reflected on the second inorganic layer 143, (1-3)-th reflected light OL1-3 reflected on the eighth insulation layer 80, and (1-4)-th reflected light OL1-4 reflected on the base substrate 110. However, the first reflected light OL1 is not limited thereto, and may further include other reflected light in addition to the (1-1)-th to (1-4)-th reflected light OL1-1 to OL1-4.

The reflectance of the third region DP-A3 may be the ratio of the third reflected light versus the third incident light LI3 (hereinafter, third reflectance). The reflectance of the second region DP-A2 may be the ratio of the second reflected light OL2 versus the second incident light LI2 (hereinafter, second reflectance). The reflectance of the first region DP-A1 may be the ratio of the first reflected light OL1 versus the first incident light LI1 (hereinafter, first reflectance).

In the transmission region TA of the first region DP-A1, the black matrix 310 and the pixel-defining pattern PDP, which have low light transmittance, may not be disposed. In addition, the connection line TWL may include a light-transmissive material. Accordingly, the first incident light LI1 may pass through to the base substrate 110 in the transmission region TA. A partial light of the first incident light LI1 may pass through components in the transmission region TA, and the rest may be reflected on the components.

In the second region DP-A2 and the third region DP-A3, the black matrix 310, the pixel-defining pattern PDP, and the pixel-defining film PDL, which have low light transmittance, may be disposed. The second incident light LI2 and the third incident light LI3 may each be blocked by the black matrix 310, the pixel-defining pattern PDP, and the pixel-defining film PDL. Accordingly, the second incident light LI2 and the third incident light LI3 may be prevented from travelling into the second region DP-A2 and the third region DP-A3, respectively.

In the transmission region TA, the first back metal layer BMLa, the second back metal layer BMLb, the pixel-defining film PDL, the pixel-defining pattern PDP, and the black matrix 310, which prevent the first reflected light OL1 from travelling outward, may not be disposed. In addition, the color filters 321, 322, and 323, which selectively transmit the same colors as the first to third light-emitting elements LD1, LD2, and LD3 respectively, may not be disposed in the transmission region TA. Accordingly, the first reflectance in the transmission region TA may be greater than the second reflectance in the second region DP-A2 and the third reflectance in the third region DP-A3.

FIG. 8A is an enlarged cross-sectional view illustrating AA of FIG. 7B.

Referring to FIG. 8A, the base substrate 110 may include a first base layer 111, a first barrier layer 112, a second base layer 113, and a second barrier layer 114. The first base layer 111 and the second base layer 112 may be formed of a light and flexible polymer. For example, the first base layer 111 and the second base layer 113 may each include polyimide (PI). Polyimide has the advantage of being easy to manufacture as a thin film, and of being transparent. However, the material of the first base layer 111 and the second base layer 113 is not limited thereto, and may include various materials.

The first barrier layer 112 may be disposed between the first base layer 111 and the second base layer 113, and may thus prevent moisture and oxygen from penetrating components constituting the display device DD (see FIG. 7B). The second barrier layer 114 may be disposed on the second base layer 113, and may thus prevent moisture and oxygen from penetrating the components constituting the display device DD (see FIG. 7B). The first barrier layer 112 and the second barrier layer 114 may be lower in water vapor transmission rate (WVTR) than the first base layer 111 and the second base layer 113, thereby effectively preventing the penetration of moisture.

The first barrier layer 112 and the second barrier layer 114 may each include an inorganic material such as a silicon compound and metal oxide. For example, the first barrier layer 112 and the second barrier layer 114 may each include silicon oxide ($SiO_x$), silicon nitride ($SiN_x$), silicon oxynitride (SiON), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), etc., but an embodiment of the inventive concept is not limited thereto.

The first barrier layer 112 may include a (1-1)-th barrier layer 112*a* and a (1-2)-th barrier layer 112*b*. The (1-1)-th barrier layer 112*a* may be disposed on the first base layer 111, and may have a first thickness T1. The (1-1)-th barrier layer 112*a* may have a first refractive index. The (1-1)-th barrier layer 112*a* may include silicon oxynitride (SiON). The first refractive index may be about 1.73. The first refractive index may be about 1.56 to about 1.9 in consideration of the process deviation of about 20% in a process.

The (1-2)-th barrier layer 112*b* may be disposed on the (1-1)-th barrier layer 112*a*, and may have a second thickness T2 greater than the first thickness T1. The (1-2)-th barrier layer 112*b* may have a second refractive index less than the first refractive index. The second refractive index is about 1.47. The second refractive index may be about 1.32 to about 1.62 in consideration of the process deviation of about 20% in a process. The (1-2)-th barrier layer 112*b* may include silicon oxide ($SiO_x$). The sum of the first thickness T1 and the second thickness T2 may be about 600 nm or less. When the sum of the first thickness T1 and the second thickness T2 is greater than about 600 nm, the process of forming the first barrier layer 112 may take a long time, and thus the efficiency of manufacturing the display device DD (see FIG. 2) may be decreased.

The second barrier layer 114 may include a (2-1)-th barrier layer 114*a* and a (2-2)-th barrier layer 114*b*. The (2-1)-th barrier layer 114*a* may be disposed on the second base layer 113, and may have a third thickness T3. The (2-1)-th barrier layer 114*a* may have the first refractive index the same as that of the (1-1)-th barrier layer 112*a*. The (2-1)-th barrier layer 114*a* may include silicon oxynitride (SiON). The (2-2)-th barrier layer 114*b* may be disposed on the (2-1)-th barrier layer 114*a*, and may have a fourth thickness T4 greater than the third thickness T3. The (2-2)-th barrier layer 114*b* may have the second refractive index the same as that of the (1-2)-th barrier layer 112*b*. The (2-2)-th barrier layer 114*b* may include silicon oxide ($SiO_x$).

A partial light of the first incident light LI1 may pass through the second barrier layer 114 and the second base layer 113, and may be reflected on the first barrier layer 112 to become the (1-4)-th reflected light OL1-4. The (1-4)-th reflected light OL1-4 may include first partial light OLA1 reflected on a boundary between the (1-1)-th barrier layer 112*a* and the (1-2)-th barrier layer 112*b*, and second partial light OLA2 reflected on a boundary between the (1-1)-th barrier layer 112*a* and the first base layer 111.

The first partial light OLA1 and the second partial light OLA2 may be destructively interfered with each other. When the first partial light OLA1 and the second partial light OLA2 are destructively interfered with each other, energy of the (1-4)-th reflected light OL1-4 may be reduced, so that a first reflectance in the transmission region TA (see FIG. 7*b*) may be reduced. The degree to which the first partial light OLA1 and the second partial light OLA2 are destructively interfered with each other may change according to the thickness of each of the (1-1)-th barrier layer 112*a* and the (1-2)-th barrier layer 112*b*. When the thickness of each of the (1-1)-th barrier layer 112*a* and the (1-2)-th barrier layer 112*b* changes, the phase difference between the first partial light OLA1 and the second partial light OLA2 may be changed accordingly, so that the degree to which the first partial light OLA1 and the second partial light OLA2 are destructively interfered with each other may be changed. The difference in reflectance according to the thickness of each of the (1-1)-th barrier layer 112$a$ and the (1-2)-th barrier layer 112$b$ will be described with reference to Table 1 and FIG. 8B as follows.

Figure 8B:
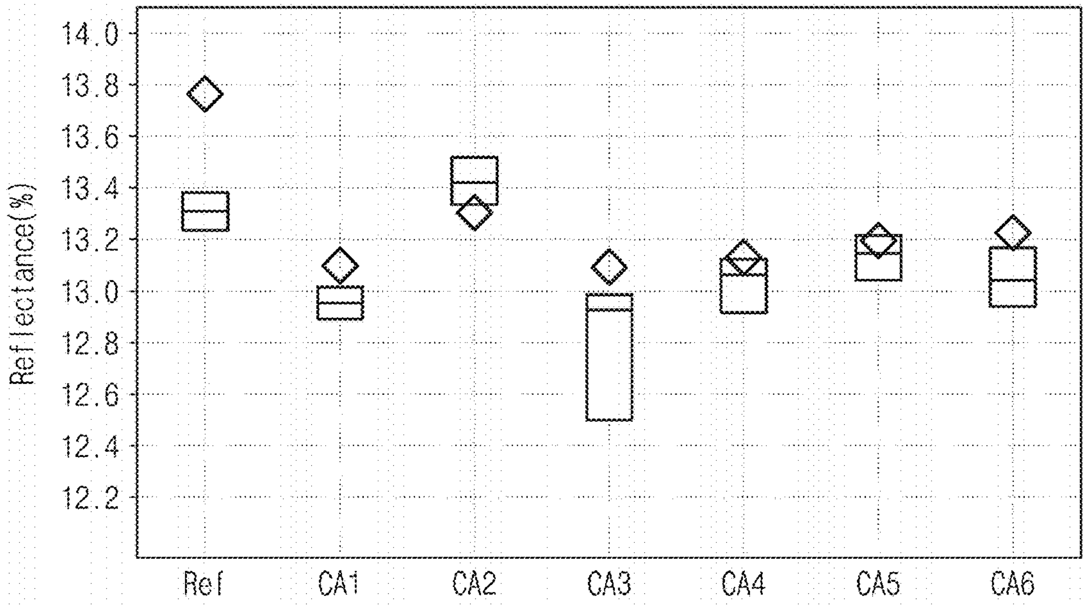
FIG. 8B is a graph showing the difference in reflectance for each CASE.

Table 1 shows the first reflectance according to the thickness of each of the first barrier layer 112 and the second barrier layer 114 of the display device DD (see FIG. 7B). FIG. 8B is a graph showing the differences in reflectance by CASES which are the results presented in Table 1.

Table 1 below and the graph in FIG. 8B show measured reflectance and simulation reflectance values of the first reflectance corresponding to REF, and CASE 1 to CASE 6. The measured reflectance median value represents the reflectance of the median value among a plurality of measured reflectance values. Each bar graph of FIG. 8B shows the range of the maximum and minimum values of the measured reflectance, and a horizontal line in the bar graph corresponds to the measured reflectance median value. Each diamond of FIG. 8B represents the simulation reflectance.

The improvement rate of Table 1 refers to the amount of change in the measured reflectance median value in each of CASE 1 to CASE 6 versus the measured reflectance median value in REF. The simulation reflectance refers to the reflectance as a simulation result of each of REF, and CASE 1 to CASE 6.

are reduced compared to the measured reflectance median value in REF which is 13.31%. Among the results, in CASE 1 and CASE 3, the improvement rates are measured −0.36% and −0.39% respectively, and through this, it may be seen that the reflectance in each CASE is significantly reduced. Accordingly, it may be seen that the first reflectance is reduced the most when the thicknesses of the (1-1)-th barrier layer 112$a$ and the (1-2)-th barrier layer 112$b$ corresponds to CASE 1 and CASE 3. The first reflectance may be about 13% or less.

That is, considering the thickness process deviation of about 30% in a process, it may be desirable that the film thickness of the (1-1)-th barrier layer 112$a$ is about 153 nm to about 207 nm, and the film thickness of the (1-2)-th barrier layer 112$b$ is about 323 nm to about 437 nm (in CASE 1). Alternatively, it may be desirable that the film thickness of the (1-1)-th barrier layer 112$a$ is about 85 nm to about 115 nm, and the film thickness of the (1-2)-th barrier layer 112$b$ is about 340 nm to about 460 nm (in CASE 3).

These results are also shown in the simulation reflectance results. Referring to the simulation reflectance results, it may be seen that the respective simulation reflectance values (13.11%, 13.28%, 13.09%, 13.15%, 13.19%, and 13.22%) in

TABLE 1

| | REF | CASE 1 | CASE 2 | CASE 3 | CASE 4 | CASE 5 | CASE 6 |
|---|---|---|---|---|---|---|---|
| Film thickness of (1-2)-th barrier layer 112b (nm) | 500 | 380 | 400 | 400 | 400 | 560 | 560 |
| Film thickness of (1-1)-th barrier layer 112a (nm) | 100 | 180 | 150 | 100 | 120 | 80 | 100 |
| Measured reflectance median value (%) | 13.31 | 12.96 | 13.42 | 12.93 | 13.07 | 13.14 | 13.04 |
| Improvement rate (%) | 0 | −0.36 | 0.1 | −0.39 | −0.25 | −0.17 | −0.28 |
| Simulation reflectance (%) | 13.77 | 13.11 | 13.28 | 13.09 | 13.15 | 13.19 | 13.22 |

In Table 1 and FIG. 8B, the refractive index of the (1-1)-th barrier layer 112$a$ is about 1.73, and the refractive index of the (1-2)-th barrier layer 112$b$ is about 1.47 in REF and CASE 1 to CASE 6. In REF, the film thickness of the (1-2)-th barrier layer 112$b$ is 500 nm, and the film thickness of the (1-1)-th barrier layer 112$a$ is 100 nm. In CASE 1, the film thickness of the (1-2)-th barrier layer 112$b$ is 380 nm, and the film thickness of the (1-1)-th barrier layer 112$a$ is 180 nm. In CASE 2, the film thickness of the (1-2)-th barrier layer 112$b$ is 400 nm, and the film thickness of the (1-1)-th barrier layer 112$a$ is 150 nm. In CASE 3, the film thickness of the (1-2)-th barrier layer 112$b$ is 400 nm, and the film thickness of the (1-1)-th barrier layer 112$a$ is 100 nm. In CASE 4, the film thickness of the (1-2)-th barrier layer 112$b$ is 400 nm, and the film thickness of the (1-1)-th barrier layer 112$a$ is 120 nm. In CASE 5, the film thickness of the (1-2)-th barrier layer 112$b$ is 560 nm, and the film thickness of the (1-1)-th barrier layer 112$a$ is 80 nm. In CASE 6, the film thickness of the (1-2)-th barrier layer 112$b$ is 560 nm, and the film thickness of the (1-1)-th barrier layer 112$a$ is 100 nm.

It may be seen that the respective measured reflectance median values in CASE 1, CASE 3, CASE 4, CASE 5 and CASE 6 which are 12.96%, 12.93%, 13.07%, 13.14%, and 13.04%, respectively, except for CASE 2 which is 13.42%

CASE 1 to CASE 6 are reduced compared to the simulation reflectance (13.77%) in REF. In particular, it may be seen that the respective simulation reflectance values (13.11% and 13.09%) in CASE 1 and CASE 3 are significantly reduced compared to the simulation reflectance (13.77%) in REF.

FIGS. 9A to 9G are photos respectively showing ghost images by CASES. The ghost image may be an unexpected image formed by external light reflection.

Figure 9A:
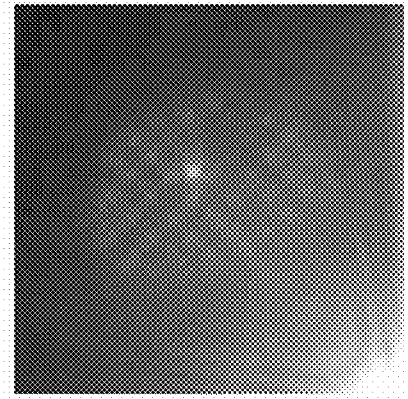
FIGS. 9A, 9B, 9C, 9D, 9E, 9F and 9G are photos of respective ghost images by CASES.
Figure 9B:
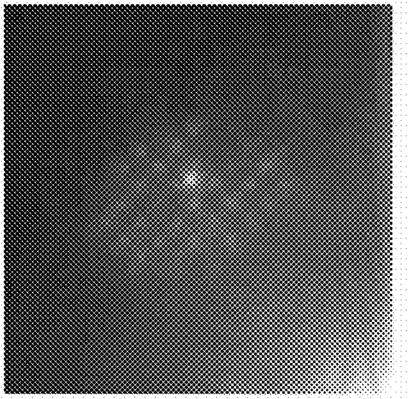
Figure 9C:
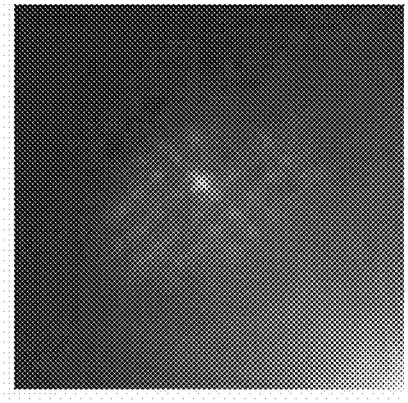
Figure 9D:
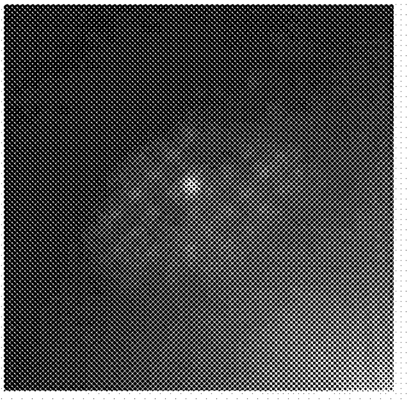
Figure 9E:
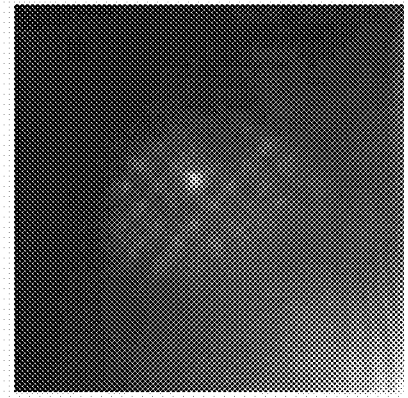
Figure 9F:
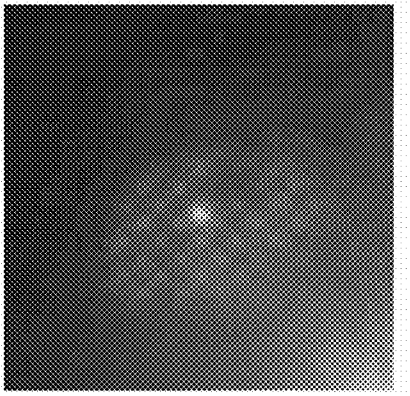
Figure 9G:
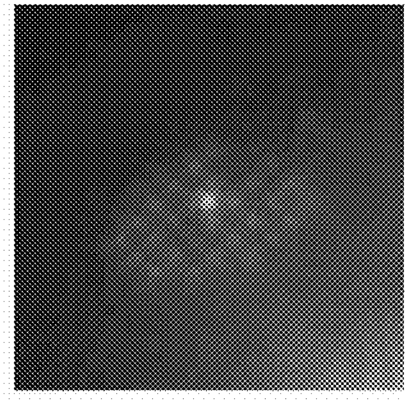

FIG. 9A shows the ghost image captured in REF. FIG. 9B shows the ghost image captured in CASE 1. FIG. 9C shows the ghost image captured in CASE 2. FIG. 9D shows the ghost image captured in CASE 3. FIG. 9E shows the ghost image captured in CASE 4. FIG. 9F shows the ghost image captured in CASE 5. FIG. 9G shows the ghost image captured in CASE 6.

The brightness of the ghost image and the area that the ghost image occupies in the entire screen may be reduced in CASE 1 to CASE 6 (see FIGS. 9B to 9G) compared to in REF (see FIG. 9A). In particular, it may be seen that the brightness of the ghost image and the area that the ghost image occupies in the entire screen are reduced in CASE 1 to CASE 3 (see FIGS. 9B and 9D).

Figure 10A:
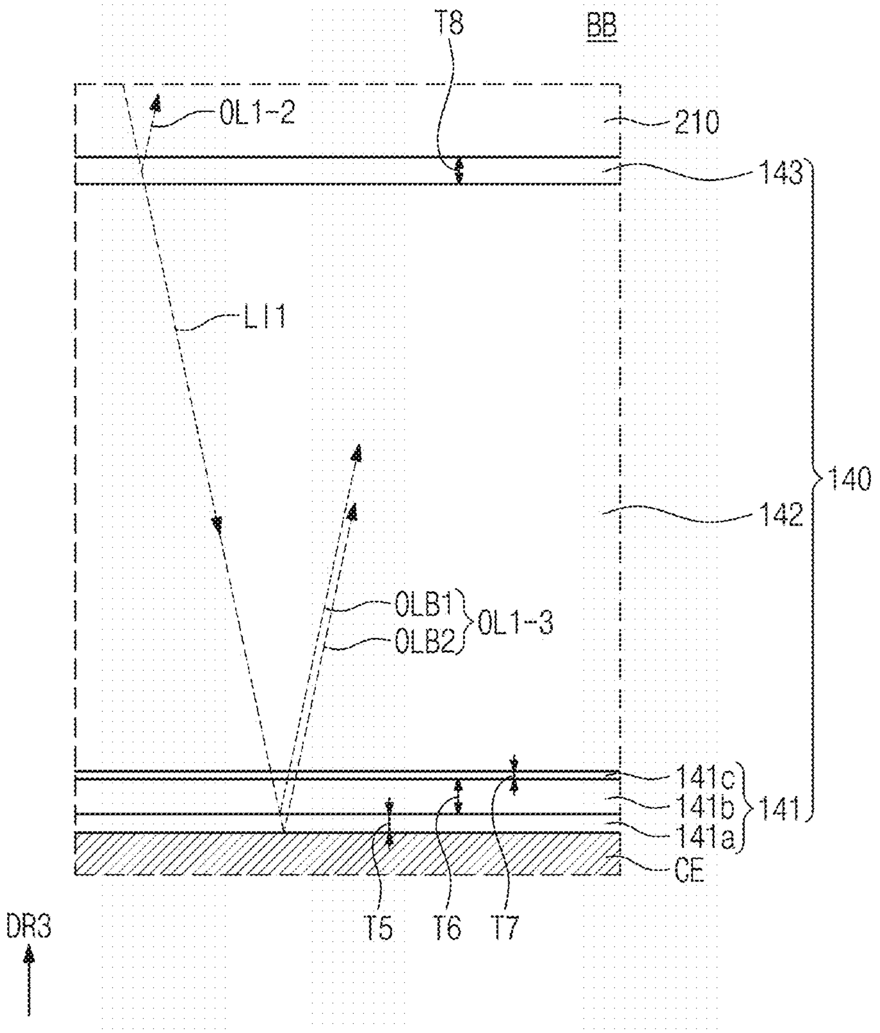
FIG. 10A is an enlarged cross-sectional view illustrating BB of FIG. 7B.

FIG. 10A is an enlarged cross-sectional view illustrating BB of FIG. 7B.

Referring to FIG. 10A, the encapsulation layer 140 may include a first inorganic layer 141, an organic layer 142, and a second inorganic layer 143. The first inorganic layer 141 may include a first thin-film inorganic layer 141*a*, a second thin-film inorganic layer 141*b*, and a third thin-film inorganic layer 141*c*. Hereinafter, the duplicate description of components the same as the components previously described will be omitted, and the same components will be denoted as the same reference numerals or symbols.

The first thin-film inorganic layer 141*a* may be disposed on the light-emitting elements LD1, LD2, and LD3 (see FIGS. 7A and 7B), and may have a third refractive index. The third refractive index is about 1.48. The third refractive index may be about 1.33 to about 1.63 in consideration of the process deviation of about 20% in a process. The first thin-film inorganic layer 141*a* may have a fifth thickness T5.

The second thin-film inorganic layer 141*b* may be disposed on the first thin-film inorganic layer 141*a*, and may have a fourth refractive index greater than the third refractive index. When the fourth refractive index is greater than the third refractive index, the light efficiency may be improved by refracting light generated in the light-emitting elements LD1, LD2, and LD3 (see FIGS. 7A and 7B). For example, referring to FIG. 7B, when a path of light generated from the second light-emitting layer EL2 is not directed to the second color filter 332, the light which is not directed to the second color filter 332 may be refracted by the first inorganic layer 141 toward the second color filter 332 to pass through the second color filter 332. The fourth refractive index may be about 1.89. Considering the process deviation of about 20% in a process, the fourth refractive index may be about 1.7 to about 2.08. The second thin-film inorganic layer 141*b* may have a sixth thickness T6 greater than the fifth thickness T5.

The third thin-film inorganic layer 141*c* may be disposed on the second thin-film inorganic layer 141*b*, and may have a fifth refractive index less than the fourth refractive index. The fifth refractive index is about 1.7. The fifth refractive index may be about 1.53 to about 1.87 in consideration of the process deviation of about 20% in a process. The third thin-film inorganic layer 141*c* may have a seventh thickness T7 less than the sixth thickness T6.

The second inorganic layer 143 may have an eighth thickness T8 less than the sixth thickness T6.

A partial light of first incident light LI1 may pass through a sensor base layer 210, and may be reflected on the second inorganic layer 143 to become a (1-2)-th reflected light OL1-2. A partial light of the first incident light LI1 may pass through the sensor base layer 210, the second inorganic layer 143, and the organic layer 142, and may be reflected on a boundary between the first thin-film inorganic layer 141*a* and the second thin-film inorganic layer 141*b*, and boundary between the common electrode CE and the first thin-film inorganic layer 141*a* to form a (1-3)-th reflected light OL1-3.

The (1-3)-th reflected light OL1-3 may include third partial light OLB1 and fourth partial light OLB2. The third partial light OLB1 may be reflected on a boundary between the first thin-film inorganic layer 141*a* and the second thin-film inorganic layer 141*b*. The fourth partial light OLB2 may be reflected on a boundary between the first thin-film inorganic layer 141*a* and a common electrode CE. The third partial light OLB1 and the fourth partial light OLB2 may be destructively interfered with each other. When the third partial light OLB1 and the fourth partial light OLB2 are destructively interfered with each other, energy of the (1-3)-th reflected light OL1-3 may be reduced, and thus the first reflectance of the transmission region TA (see FIG. 7B) may be reduced.

The degree to which the third partial light OLB1 and the fourth partial light OLB2 are destructively interfered with each other may change according to the thickness and refractive index of each of the first to third thin-film inorganic layers 141*a*, 141*b*, and 141*c*. The difference in reflectance according to the thickness and refractive index of each of the first to third thin-film inorganic layers 141*a*, 141*b*, and 141*c* will be described with reference to Table 2 and FIG. 10B as follows.

Figure 10B:
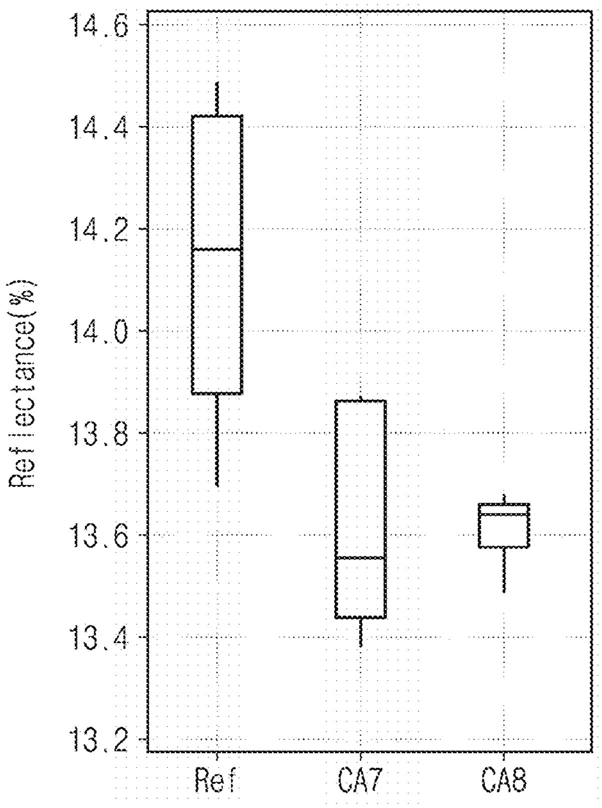
FIG. 10B is a graph showing the difference in reflectance for each CASE.

Table 2 shows the first reflectance values according to the thickness and refractive index of each of the first to third thin-film inorganic layers 141*a*, 141*b*, and 141*c* of the display device DD. FIG. 10B is a graph showing the differences in reflectance by CASES that are the results presented in Table 2.

Table 2 below and the graph of FIG. 10B show measured reflectance values of the first reflectance corresponding to REF, CASE 7, and CASE 8. The measured reflectance median value represents the reflectance of the median value among a plurality of measured reflectance values. Each bar graph of FIG. 10B shows the range of the maximum and minimum values of measured reflectance, and a horizontal line in the bar graph corresponds to the measured reflectance median value.

The improvement rate in Table 2 refers to the amount of change in the measured reflectance median value in each of CASE 7 and CASE 8 versus the measured reflectance median value in REF.

TABLE 2

| | REF | CASE 7 | CASE 8 |
|---|---|---|---|
| Film thickness(nm)/refractive index of first thin-film inorganic layer 141a | 120/1.57 | 200/1.48 | 200/1.48 |
| Film thickness (nm)/refractive index of second thin-film inorganic layer 141b | 1000/1.77 | 860/1.89 | 750/1.89 |
| Film thickness (nm)/refractive index of third thin-film inorganic layer 141c | 65/1.62 | 65/1.70 | 65/1.70 |
| Measured reflectance median value (%) | 14.15 | 13.55 | 13.64 |
| Improvement rate (%) | 0 | −0.6 | −0.56 |

In Table 2 and FIG. 10B, in REF, the film thickness of the first thin-film inorganic layer 141*a* is 120 nm, and the refractive index of the first thin-film inorganic layer 141*a* is 1.57. The film thickness of the second thin-film inorganic layer 141*b* is 1000 nm, and the refractive index of the second thin-film inorganic layer 141*b* is 1.77. The film thickness of the third thin-film inorganic layer 141*c* is 65 nm, and the refractive index of the third thin-film inorganic layer 141*c* is 1.62.

In CASE 7, the film thickness of the first thin-film inorganic layer 141*a* is 200 nm, and the refractive index of the first thin-film inorganic layer 141*a* is 1.48. The film thickness of the second thin-film inorganic layer 141*b* is 860 nm, and the refractive index of the second thin-film inorganic layer 141*b* is 1.89. The film thickness of the third thin-film inorganic layer 141*c* is 65 nm, and the refractive index of the third thin-film inorganic layer 141*c* is 1.70.

In CASE 8, the film thickness of the first thin-film inorganic layer 141*a* is 200 nm, and the refractive index of the first thin-film inorganic layer 141*a* is 1.48. The film thickness of the second thin-film inorganic layer 141*b* is 750 nm, and the refractive index of the second thin-film inorganic layer 141*b* is 1.89. The film thickness of the third thin-film inorganic layer 141*c* is 65 nm, and the refractive index of the third thin-film inorganic layer 141*c* is 1.7.

It may be seen that in CASE 7 and CASE 8, the measured reflectance median values, which are 13.55% and 13.64% respectively, are reduced compared to the measured reflectance median value in REF that is 14.15%. In CASE 7 and CASE 8, the improvement rates are measured −0.6 and −0.56 respectively, and it may be seen that the reflectance values are significantly reduced. Therefore, the first reflectance may be reduced when each of the first to third thin-film inorganic layers 141*a*, 141*b*, and 141*c* has the thickness and refractive index corresponding to CASE 7 and CASE 8.

Considering the thickness process deviation of about 30% in a process, the thickness of the first thin-film inorganic layer 141*a* may be about 170 nm to about 230 nm. The thickness of the second thin-film inorganic layer 141*b* may be about 731 nm to about 989 nm. The thickness of the third thin-film inorganic layer 141*c* may be about 55 nm to about 75 nm (in CASE 7).

Alternatively, the thickness of the first thin-film inorganic layer 141*a* may be about 170 nm to about 230 nm. The thickness of the second thin-film inorganic layer 141*b* may be about 638 nm to about 863 nm. The thickness of the third thin-film inorganic layer 141*c* is about 55 nm to about 75 nm (in CASE 8).

Considering the refractive index process deviation of about 20% in a process, the refractive index of the first thin-film inorganic layer 141*a* may be about 1.33 to about 1.63. The refractive index of the second thin-film inorganic layer 141*b* may be about 1.7 to about 2.08. The refractive index of the third thin-film inorganic layer 141*c* may be about 1.53 to about 1.87.

According to what has been previously described, the reflectance may be minimized by adjusting the refractive index and thickness of each of layers constituting first and second barrier layers of a display panel.

In addition, the reflectance may be minimized by adjusting the refractive index and thickness of each of layers constituting an encapsulation layer.

Although the embodiments of the inventive concept have been described, it is understood that the inventive concept should not be limited to these embodiments but various changes and modifications can be made by one ordinary skilled in the art within the spirit and scope of the inventive concept as hereinafter claimed. Therefore, the technical scope of the inventive concept should not be limited to the contents described in the detailed description of the specification, but should be defined by the claims.

What is claimed is:

1. An electronic device comprising:
- a display panel including a display region having a first region and a second region which has a lower transmittance than the first region, and a non-display region adjacent to the display region; and
- an electronic module disposed under the display panel, and overlapping the first region,
- wherein the display panel includes:
  - a base substrate having a first base layer, a second base layer, and a first barrier layer disposed between the first base layer and the second base layer and overlapping the display region and the non-display region,
  - a light-emitting element disposed on the base substrate and overlapping the display region,
  - a pixel circuit disposed in the second region,
  - a connection line connected to the light-emitting element in the first region and connected to the pixel circuit in the second region, and
  - an encapsulation layer disposed on the light-emitting element and covering the light-emitting element, and
- wherein the first barrier layer includes:
  - a (1-1)-th barrier layer disposed on the first base layer and having a first thickness and a first refractive index, and
  - a (1-2)-th barrier layer disposed on the (1-1)-th barrier layer and having a second thickness greater than the first thickness and a second refractive index less than the first refractive index, wherein the first thickness and the second thickness are chosen such that reflected light from a bottom surface of the (1-1)-th barrier layer destructively interferes with reflected light from a bottom surface of the (1-2)-th barrier layer and wherein the bottom surface of the (1-2)-th barrier layer is closer to the (1-1)th barrier layer than a top surface of the (1-2)-th barrier layer and the bottom surface of the (1-1)-th barrier layer is farther from the (1-2)-th barrier layer than a top surface of the (1-1)-th barrier laver.

2. The electronic device of claim 1, wherein the first thickness is equal to or greater than about 153 nm and less than or equal to about 207 nm, and the second thickness is equal to or greater than about 323 nm and less than or equal to about 437 nm.

3. The electronic device of claim 1, wherein the first thickness is equal to or greater than about 85 nm and less than or equal to about 115 nm, and the second thickness is greater than or equal to about 340 nm and less than or equal to about 460 nm.

4. The electronic device of claim 1, wherein a sum of the first thickness and the second thickness is about 600 nm or less.

5. The electronic device of claim 1, wherein the (1-1)-th barrier layer comprises silicon oxynitride, and the (1-2)-th barrier layer comprises silicon oxide.

6. The electronic device of claim 1, wherein the first refractive index is greater than or equal to about 1.56 and less than or equal to about 1.9, and
- wherein the second refractive index is greater than or equal to about 1.32 and less than or equal to about 1.62.

7. The electronic device of claim 1, wherein the base substrate further comprises a second barrier layer disposed on the second base layer, and
- wherein the second barrier layer includes:
  - a (2-1)-th barrier layer disposed on the second base layer and having a third thickness and the first refractive index, and
  - a (2-2)-th barrier layer disposed on the (2-1)-th barrier layer, having a fourth thickness greater than the third thickness, and having the second refractive index.

8. The electronic device of claim 7, wherein the (2-1)-th barrier layer comprises silicon oxynitride, and the (2-2)-th barrier layer comprises silicon oxide.

9. The electronic device of claim 1, wherein the encapsulation layer comprises:
- a first inorganic layer disposed on the light-emitting element;
- an organic layer disposed on the first inorganic layer; and
- a second inorganic layer disposed on the organic layer, and
- wherein the first inorganic layer includes:
  - a first thin-film inorganic layer disposed on the light-emitting element and having a third refractive index, and a second thin-film inorganic layer disposed on the first thin-film inorganic layer and having a fourth refractive index greater than the third refractive index.

10. The electronic device of claim 9, wherein the first thin-film inorganic layer has a thickness of greater than or equal to about 170 nm and less than or equal to about 230 nm, and wherein the second thin-film inorganic layer has a thickness of greater than or equal to about 731 nm and less than or equal to about 989 nm.

11. The electronic device of claim 9, wherein the first thin-film inorganic layer has a thickness of greater than or equal to about 170 nm and less than or equal to about 230 nm, and wherein the second thin-film inorganic layer has a thickness of greater than or equal to about 638 nm and less than or equal to about 863 nm.

12. The electronic device of claim 9, wherein the third refractive index is greater than or equal to about 1.33 and less than or equal to about 1.63, and wherein the fourth refractive index is greater than or equal to about 1.7 and less than or equal to about 2.08.

13. The electronic device of claim 1, wherein the connection line includes a light-transmissive material.

14. The electronic device of claim 1, wherein a reflectance for light passing through the first region is about 13% or less.

15. A display panel comprising:

a base substrate including a first base layer, a second base layer, and a first barrier layer disposed between the first base layer and the second base layer;

a light-emitting element disposed on the base substrate in a display area;

an encapsulation layer disposed on the light-emitting element and covering the light-emitting element;

a pixel circuit disposed in a second region of the display area the second region having a lower transmittance than a first region of the display area; and a connection line connected to the light emitting element disposed in the first region and the pixel circuit disposed in the second region, wherein the first barrier layer includes:

a (1-1)-th barrier layer disposed on the first base layer and having a first thickness and a first refractive index, and a (1-2)-th barrier layer disposed on the (1-1)-th barrier layer, having a second thickness greater than the first thickness, and having a second refractive index less than the first refractive index, and wherein a sum of the first thickness and the second thickness is about 600 nm or less, wherein the first thickness and the second thickness are chosen such that reflected light from a bottom surface of the (1-1)-th barrier layer destructively interferes with reflected light from a bottom surface of the (1-2)-th barrier layer and wherein the bottom surface of the (1-2)-th barrier layer is closer to the (1-1)-th barrier layer than a top surface of the (1-2)-th barrier layer and the bottom surface of the (1-1)-th barrier layer is farther from the (1-2)-th barrier layer than a top surface of the (1-1)-th barrier layer.

16. The display panel of claim 15, wherein the first thickness is greater than or equal to about 153 nm and less than or equal to about 207 nm, and the second thickness is greater than or equal to about 323 nm and less than or equal to about 437 nm.

17. The display panel of claim 15, wherein the first thickness is greater than or equal to about 85 nm and less than or equal to about 115 nm, and the second thickness is greater than or equal to about 340 nm and less than or equal to about 460 nm.

18. The display panel of claim 15, wherein the first refractive index is greater than or equal to about 1.56 and less than or equal to about 1.9, and wherein the second refractive index is greater than or equal to about 1.32 and less than or equal to about 1.62.

19. The display panel of claim 15, wherein the (1-1)-th barrier layer comprises silicon oxynitride, and the (1-2)-th barrier layer comprises silicon oxide.

* * * * *